(12) United States Patent
Goodwin

(10) Patent No.: US 8,993,974 B2
(45) Date of Patent: Mar. 31, 2015

(54) COLOR TIME DOMAIN INTEGRATION CAMERA HAVING A SINGLE CHARGE COUPLED DEVICE AND FRINGE PROJECTION AUTO-FOCUS SYSTEM

(71) Applicant: Nikon Corporation, Tokyo (JP)

(72) Inventor: Eric Peter Goodwin, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 82 days.

(21) Appl. No.: 13/790,295

(22) Filed: Mar. 8, 2013

(65) Prior Publication Data

US 2013/0330662 A1 Dec. 12, 2013

Related U.S. Application Data

(60) Provisional application No. 61/658,819, filed on Jun. 12, 2012, provisional application No. 61/674,766, filed on Jul. 23, 2012.

(51) Int. Cl.

| | |
|---|---|
| *G01J 1/42* | (2006.01) |
| *G01B 11/14* | (2006.01) |
| *G01B 11/25* | (2006.01) |
| *G03F 7/20* | (2006.01) |
| *G02B 7/36* | (2006.01) |
| *G03F 9/00* | (2006.01) |

(52) U.S. Cl.
CPC . *G01J 1/42* (2013.01); *G01B 11/14* (2013.01); *G01B 11/25* (2013.01); *G03F 7/70* (2013.01); *G02B 7/36* (2013.01); *G03F 9/7026* (2013.01)
USPC .................................................. 250/370.01

(58) Field of Classification Search
CPC ............ G01J 1/42; G01B 11/14; H01L 25/00
USPC ..................... 250/370.1, 216, 578.1
See application file for complete search history.

(56) References Cited

U.S. PATENT DOCUMENTS

| | | | |
|---|---|---|---|
| 6,532,086 B1 | 3/2003 | Tallie | |
| 6,611,316 B2 | 8/2003 | Sewell | |
| 6,778,257 B2 | 8/2004 | Bleeker et al. | |
| 7,023,610 B2 | 4/2006 | Ohtsuki et al. | |

(Continued)

OTHER PUBLICATIONS

International Search Report and Written Opinion for PCT/US12/43186 dated Sep. 14, 2012 with its entire prosecution and case history.

(Continued)

*Primary Examiner* — David Porta
*Assistant Examiner* — Faye Boosalis
(74) *Attorney, Agent, or Firm* — Roeder & Broder LLP

(57) ABSTRACT

A detector (550) for detecting light (248B) from a light source (248A) comprises a single array of pixels (574) and a first mask (576). The single array of pixels (574) includes a plurality of rows of pixels (574R), and a plurality of columns of pixels (574C) having at least a first active column of pixels (574AC) and a spaced apart second active column of pixels (574AC). The first mask (576) covers one of the plurality of columns of pixels (574C) to provide a first masked column of pixels (574MC) that is positioned between the first active column of pixels (574AC) and the second active column of pixels (574AC). Additionally, a charge is generated from the light (248B) impinging on the first active column of pixels (574AC), is transferred to the first masked column of pixels (574MC), and subsequently is transferred to the second active column of pixels (574AC).

27 Claims, 14 Drawing Sheets

(56) References Cited

U.S. PATENT DOCUMENTS

| | | |
|---|---|---|
| 8,149,382 B2 | 4/2012 | Hidaka et al. |
| 2001/0035168 A1 | 11/2001 | Meyer et al. |
| 2008/0149812 A1* | 6/2008 | Ward et al. ............ 250/208.1 |
| 2009/0116039 A1 | 5/2009 | Hidaka |
| 2009/0135437 A1 | 5/2009 | Smith |
| 2010/0067021 A1 | 3/2010 | Danzebrink |
| 2010/0245829 A1 | 9/2010 | Goodwin et al. |
| 2011/0071784 A1 | 3/2011 | Smith et al. |
| 2011/0086315 A1 | 4/2011 | Ichinose |
| 2011/0278475 A1* | 11/2011 | Lundquist et al. ...... 250/459.1 |
| 2013/0308140 A1 | 11/2013 | Goodwin et al. |

OTHER PUBLICATIONS

U.S. Appl. No. 13/588,919, filed Aug. 17, 2012 with Filing Receipt with its entire prosecution and case history.

U.S. Appl. No. 13/066,741, filed Apr. 22, 2011 with Filing Receipt with its entire prosecution and case history.

U.S. Appl. No. 61/647,324, filed May 15, 2012 with Filing Receipt with its entire prosecution and case history.

Hamamatsu Photonics K.K., Systems Division, "Hamamatsu Data Sheet for 3 CCD Cooled Digital Color Camera ORCA-3CCD", Catalog, Jul. 2007, Hamamatsu City, Japan.

Nikon Corporation, "Introduction to Charge-Coupled Devices (CCDs)", Website: http://www.microscopyu.com/articles/digitalimaging/ccdintro.html.

* cited by examiner

US 8,993,974 B2

COLOR TIME DOMAIN INTEGRATION CAMERA HAVING A SINGLE CHARGE COUPLED DEVICE AND FRINGE PROJECTION AUTO-FOCUS SYSTEM

RELATED INVENTION

The application claims priority on U.S. Provisional Application Ser. Nos. 61/658,819 filed on Jun. 12, 2012, entitled "COLOR TIME DOMAIN INTEGRATION CAMERA HAVING A SINGLE CHARGE COUPLED DEVICE AND FRINGE PROJECTION AUTO-FOCUS SYSTEM", and 61/674,766 filed on Jul. 23, 2012, entitled "COLOR TIME DOMAIN INTEGRATION CAMERA HAVING A SINGLE CHARGE COUPLED DEVICE AND FRINGE PROJECTION AUTO-FOCUS SYSTEM". As far as is permitted, the contents of U.S. Provisional Application Ser. Nos. 61/658,819 and 61/674,766 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that positions a reticle, an optical assembly having an optical axis, a wafer stage assembly that positions a semiconductor wafer, a measurement (or position) system, and a control system. The measurement system constantly monitors the position of the reticle and the wafer, and the control system controls each stage assembly to constantly adjust the position of the reticle and the wafer. The features of the images transferred from the reticle onto the wafer are extremely small. Accordingly, the precise positioning of the wafer and the reticle is critical to the manufacturing of high quality wafers.

There is a constant desire to improve the accuracy of the measurement system. In certain designs, the measurement system includes an autofocus system that is used to map the topography of the wafer surface along the optical axis prior to exposing the wafer. Subsequently, with information regarding the position along the optical axis, the wafer stage assembly can be controlled to properly position the wafer along the optical axis. Unfortunately, previous autofocus systems have been unsatisfactory, in that they can be slow, overly complex, and/or expensive, and/or such autofocus systems have only been able to achieve suboptimal results.

SUMMARY

The present embodiment is directed toward a detector for detecting light from a light source. In certain embodiments, the detector comprises a single array of pixels and a first mask. The single array of pixels includes a plurality of rows of pixels, and a plurality of columns of pixels having at least a first active column of pixels and a spaced apart second active column of pixels. The first mask covers one of the plurality of columns of pixels to provide a first masked column of pixels that is positioned between the first active column of pixels and the second active column of pixels. Additionally, a charge is generated from the light impinging on the first active column of pixels, is transferred to the first masked column of pixels, and subsequently is transferred to the second active column of pixels.

In some embodiments, an accumulation of the charge from the light impinging on the first active column of pixels and the second active column of pixels generates an output charge.

In one embodiment, no active column of pixels is positioned adjacent to another active column of pixels. In certain embodiments, the first active column of pixels and the second active column are arranged along a first direction, and are spaced apart from one another along a second direction that crosses the first direction. For example, the second direction can be orthogonal to the first direction.

In some embodiments, the plurality of columns of pixels further includes a third active column of pixels that is spaced apart from the first active column of pixels and the second active column of pixels. In one such embodiment, the detector further comprises a second mask that covers one of the plurality of columns of pixels to provide a second masked column of pixels that is positioned between the second active column of pixels and the third active column of pixels. Moreover, in one embodiment, the plurality of columns of pixels further includes a fourth active column of pixels that is spaced apart from the first active column of pixels, the second active column of pixels, and the third active column of pixels. In such embodiment, the detector can further comprise a third mask that covers one of the plurality of columns of pixels to provide a third masked column of pixels that is positioned between the third active column of pixels and the fourth active column of pixels.

In certain embodiments, the detector further comprises a second mask that covers one of the plurality of columns of pixels to provide a second masked column of pixels that is positioned between the first active column of pixels and the second active column of pixels. In one such embodiment, the detector can further comprise a third mask that covers one of the plurality of columns of pixels to provide a third masked column of pixels that is positioned between the first active column of pixels and the second active column of pixels.

In one embodiment, the detector further comprises a lenslet array that is positioned substantially adjacent to a top surface of the single array of pixels.

In some applications, the present embodiment is further directed toward a position system for measuring the position of a work piece. In certain embodiments, the position system comprises a light source that generates (i) a first light beam that is directed at the work piece at a first time, the first light beam having a first characteristic, and (ii) a second light beam that is directed at the work piece at a second time, the second light beam having a second characteristic that is different than the first characteristic; and the detector as described above that detects the first light beam and the second light beam from the light source.

In one such embodiment, the first characteristic is a first wavelength range and the second characteristic is a second wavelength range that is different than the first wavelength range. Alternatively, in another such embodiment, the first characteristic is a first polarization and the second characteristic is a second polarization that is different than the first polarization. Still alternatively, in another such embodiment, the first characteristic includes the first light beam being a measurement beam, and wherein the second characteristic includes the second light beam being a reference beam.

Additionally, in some embodiments, the detector further comprises a second mask that covers one of the plurality of columns of pixels to provide a second masked column of pixels that is positioned between the first active column of pixels and the second active column of pixels. In such embodiments, the light source further generates a third light beam that is directed at the work piece at a third time, the third light beam having a third characteristic that is different than at least one of the first characteristic and the second characteristic. Moreover, in such embodiments, the detector detects the first light beam, the second light beam and the third light beam from the light source.

Further, in one such embodiment, the detector further comprises a third mask that covers one of the plurality of columns of pixels to provide a third masked column of pixels that is positioned between the first active column of pixels and the second active column of pixels. In such embodiment, the light source further generates a fourth light beam that is directed at the work piece at a fourth time, the fourth light beam having a fourth characteristic that is different than at least one of the first characteristic, the second characteristic and the third characteristic. Moreover, in such embodiment, the detector detects the first light beam, the second light beam, the third light beam and the fourth light beam from the light source.

Still further, the present embodiment is also directed toward an exposure apparatus including a stage assembly that positions a work piece, and the position system as described above that measures the position of the work piece. The present embodiment is further directed toward a process for manufacturing a wafer that includes the steps of providing a substrate, and transferring a mask pattern to the substrate with the exposure apparatus as described above.

In another application, the present embodiment is further directed toward a method for detecting light from a light source, the method comprising the steps of (i) providing a single array of pixels including a plurality of rows of pixels, and a plurality of columns of pixels having at least a first active column of pixels and a spaced apart second active column of pixels; (ii) covering one of the plurality of columns of pixels with a first mask to provide a first masked column of pixels that is positioned between the first active column of pixels and the second active column of pixels; (iii) generating a charge from the light impinging on the first active column of pixels; (iv) transferring the charge from the first active column of pixels to the first masked column of pixels; and (v) subsequently transferring the charge to the second active column of pixels.

Additionally, the present embodiment is still further directed toward a method for measuring the position of a work piece, the method comprising the steps of (i) generating a first light beam with a light source, the first light beam having a first characteristic; (ii) directing the first light beam at the work piece at a first time, the work piece reflecting the first light beam; (iii) generating a second light beam with the light source, the second light beam having a second characteristic that is different than the first characteristic; (iv) directing the second light beam at the work piece at a second time, the work piece reflecting the second light beam; and (v) detecting the first light beam and the second light beam that are reflected off of the work piece with the method of claim 14.

BRIEF DESCRIPTION OF THE DRAWINGS

The novel features of embodiments of this invention as to its structure and its operation, will be best understood from the accompanying drawings, taken in conjunction with the accompanying description, in which similar reference characters refer to similar parts, and in which.

DESCRIPTION

The present embodiment is directed to a chromatic, time domain integration ("TDI") charge-coupled device ("CCD") that can be used with a fringe projection type autofocus ("AF") system that is used to measure the position of a workpiece, e.g. a wafer. As provided herein, such a fringe projection ("FP") type autofocus (AF") system can include a light source assembly that generates a plurality of spaced apart slits of light (or a continuous fringe pattern of light) wherein a first portion of the slits (or fringes) of light are concurrently directed at and reflected off of a working surface of the work piece toward a detector assembly, and a second portion of the slits (or fringes) of light are concurrently directed at and reflected off of a redirector assembly toward the detector assembly. A non-exclusive example of a FP type AF system is disclosed in PCT Application No. PCT/US12/43186, filed on Jun. 19, 2012, and entitled "AUTOFOCUS SYSTEM WITH REFERENCE CONFIGURATION". As far as is permitted, the contents of PCT Application No. PCT/US12/43186 are incorporated herein by reference. Alternatively, the TDI CCD provided herein can be used in another type of system.

Figure 1:
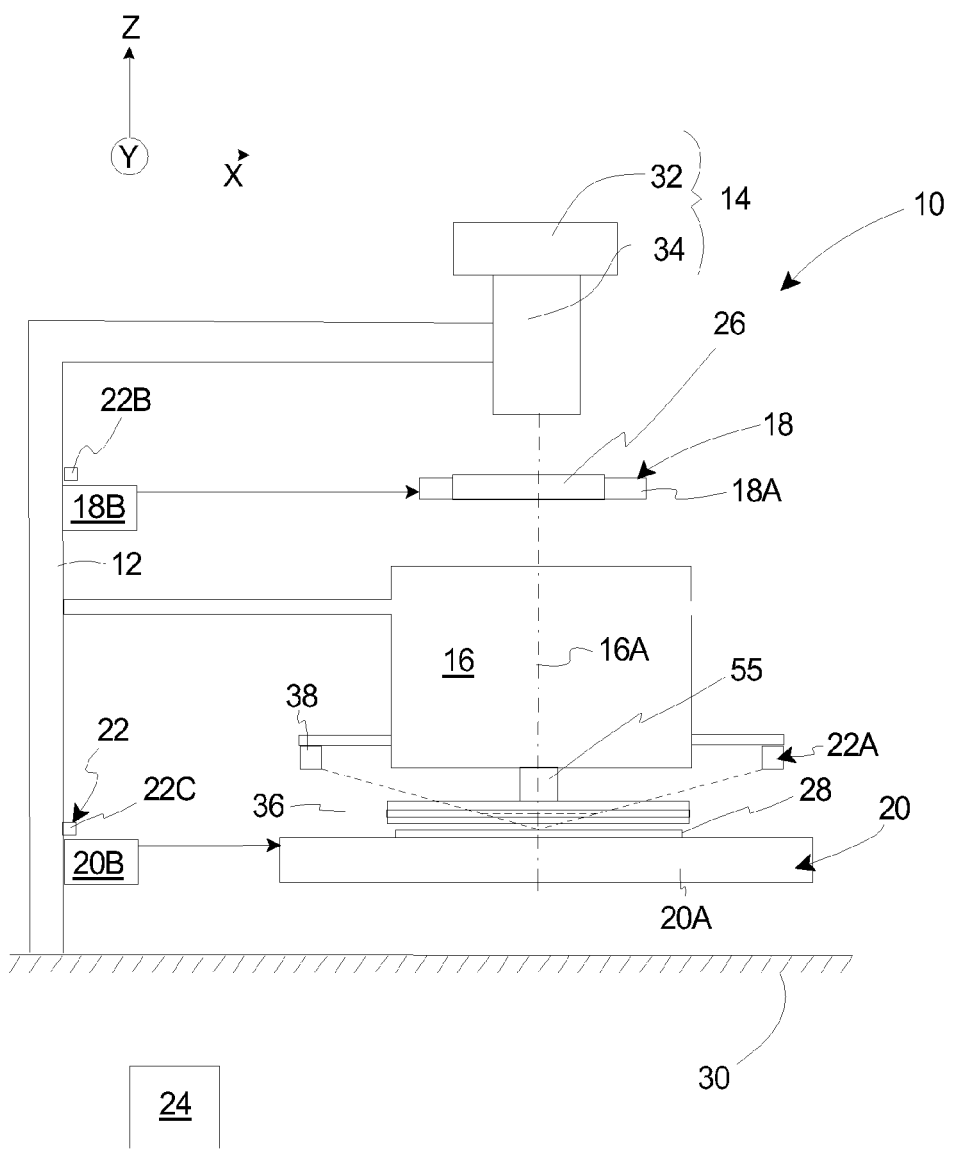
FIG. 1 is a schematic illustration of an embodiment of an exposure apparatus, the exposure apparatus including an autofocus system.

FIG. 1 is a schematic illustration of an embodiment of a precision assembly, namely an exposure apparatus 10. The exposure apparatus 10 includes an apparatus frame 12, an illumination system 14 (irradiation apparatus), an optical assembly 16, a reticle stage assembly 18, a wafer stage assembly 20, a position system 22, and a control system 24. The design of the components of the exposure apparatus 10 can be varied to suit the design requirements of the exposure apparatus 10.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, a floor, or some other supporting structure.

As an overview, the position system 22 includes an autofocus system 22A that is faster, simpler and less expensive than previous autofocus systems in order to measure the position of a work piece, e.g., the wafer 28, along a Z axis with improved accuracy. More specifically, in certain embodiments, the autofocus system 22A is uniquely designed to require only a single detector that is able to capture signals with different spectral properties. Moreover, the autofocus system 22A utilizes a light source(s) that is synchronized to the charge transfer of a detector, e.g., the detector 550 illustrated in FIG. 5A, in such a way that multiple color images can be captured simultaneously, which is especially useful for the fringe projection type autofocus system. As a result thereof, the wafer 28 can be positioned with improved accuracy, and the exposure apparatus 10 can be used to manufacture higher density wafers 28.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. Alternatively, the exposure apparatus 10 can be a step-and-repeat type photolithography system that exposes the reticle 26 while the reticle 26 and the wafer 28 are stationary. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 is rigid and supports the components of the exposure apparatus 10. The apparatus frame 12 illustrated in FIG. 1 supports the reticle stage assembly 18, the optical assembly 16, the wafer stage assembly 20, and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam selectively illuminates different portions of the reticle 26 and exposes the wafer 28.

The illumination source 32 can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× (unit magnification) or magnification system (enlargement system).

The reticle stage assembly 18 holds and positions the reticle 26 relative to the optical assembly 16 and the wafer 28. In FIG. 1, the reticle stage assembly 18 includes a reticle stage 18A that retains the reticle 26, and a reticle stage mover assembly 18B that positions the reticle stage 18A and the reticle 26. The reticle stage mover assembly 18B can be designed to move the reticle 26 in six degrees of freedom, i.e. along the X, Y and Z axes, and about the X, Y and Z axes. Alternatively, the reticle stage mover assembly 18B can be designed to move the reticle 26 in less than six degrees of freedom.

Somewhat similarly, the wafer stage assembly 20 holds and positions the wafer 28 with respect to the projected image of the illuminated portions of the reticle 26. In FIG. 1, the wafer stage assembly 20 includes a wafer stage 20A that retains the wafer 28, and a wafer stage mover assembly 20B that positions the wafer stage 20A and the wafer 28. The wafer stage mover assembly 20B can be designed to move the wafer 28 in six degrees of freedom, i.e. along the X, Y and Z axes, and about the X, Y and Z axes. Alternatively, the wafer stage mover assembly 20B can be designed to move the wafer 28 in less than six degrees of freedom. In this embodiment, the wafer 28 can be scanned while the wafer stage assembly 20 moves the wafer 28 along the Y axis.

The position system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the position system 22 can utilize multiple laser interferometers, encoders, autofocus systems, and/or other measuring devices in addition to the autofocus system 22A.

In FIG. 1, the position system 22 includes (i) a reticle measurement system 22B (only a portion is illustrated in FIG. 1) that monitors the position of the reticle stage 18A and the reticle 26, (ii) a wafer measurement system 22C (only a portion is illustrated in FIG. 1) that monitors the position of the wafer stage 20A and the wafer 28 along the X and Y axes, and about the Z axis, and (iii) the autofocus system 22A that maps the topography of the wafer 28 relative to the optical assembly 16 along the Z axis (i.e. along an optical axis 16A of the optical assembly 16), about the X axis, and about the Y axis prior to exposure with improved accuracy. As a result thereof, the wafer stage assembly 20 can be controlled to position the wafer 28 with improved accuracy.

In certain embodiments, the autofocus system 22A can be fixedly secured to the optical assembly 16 or to a support frame which supports the optical assembly 16. As provided herein, the autofocus system 22A includes a reference system 36 that provides a reference signal that relates to the measurement of everything that is changing in the autofocus system 22A except for the position of the wafer 28 along the optical axis 16A, and a measurement system 38 that provides a measurement signal that relates to the measurement of everything changing in the autofocus system 22A including the position of the wafer 28 along the optical axis 16A. By subtracting the reference signal from the measurement signal, the position of the wafer 28 along the optical axis 16A is determined, thereby reducing the stability requirements on much of the components of the autofocus system 22A.

In this embodiment, the reference system 36 and the measurement system 38 are secured to and monitor the position of the wafer 28 relative to the optical assembly 16. Alternatively, these systems 36, 38 can be secured to and monitor the position of the wafer 28 relative to another reference.

The control system 24 is connected to the reticle stage assembly 18, the wafer stage assembly 20, and the position system 22. The control system 24 receives information from the position system 22 and controls the stage assemblies 18, 20 to precisely position the reticle 26 and the wafer 28. The control system 24 can include one or more processors and circuits.

Figure 2A:
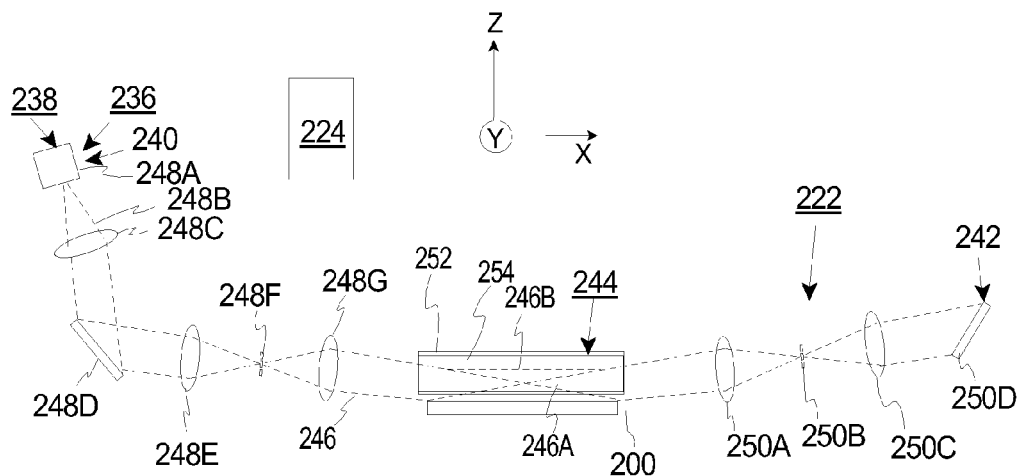
FIG. 2A is a simplified side view of a work piece, a control system, and an embodiment of the autofocus system, the autofocus system including a light source assembly that projects light having a continuous fringe pattern.

FIG. 2A is a simplified side view of a work piece 200, a control system 224, and an embodiment of an autofocus system 222 that measures the position of a working surface 200A of the work piece 200 along the Z axis, about the X axis and about the Y axis. In this embodiment, for example, the work piece 200 can be the wafer 28 (illustrated in FIG. 1) and the working surface 200A is the surface where the features are transferred. Alternatively, the autofocus system 222 can be used to monitor the position of other types of work pieces 200 (e.g., the reticle 26 illustrated in FIG. 1) during manufacturing and/or inspection.

In certain embodiments, the position of the work piece 200 along the Z axis for each X, Y position can be premapped prior to exposing the work piece 200. With this design, for each X, Y position of the work piece 200, the control system 224 can be controlled to make the appropriate adjustment to the Z position of the work piece 200 based on the premapped information. Alternatively, for example, the autofocus system 222 can continuously measure the position of the work piece 200 along the Z axis. With this design, the stage mover assembly 20 (illustrated in FIG. 1) can be controlled to make real time adjustments to the Z position of the work piece 200 based on the measurements from the autofocus system 222.

In FIG. 2A, the autofocus system 222 is a fringe projection type system that includes a reference system 236 and a measurement system 238. The design and positioning of each of these components can be varied to achieve the measurement requirements of the autofocus system 222. In FIG. 2A, the reference system 236 and the measurement system 238 share a common light source assembly 240, and a common detector assembly 242. The common detector assembly 242 can be preferred since it reduces errors due to any instabilities of the detector assembly 242. Alternatively, for example, the reference system 236 and the measurement system 238 can have independent light source assemblies, and detector assemblies. As provided herein, in one embodiment, the light source assembly 240 projects light that results in a sinusoidal irradiance pattern, with such sinusoidal irradiance pattern being usable with the present autofocus system 222. A discussion of a sinusoidal irradiance fringe pattern autofocus system is contained in U.S. application Ser. No. 13/066,741, filed on Apr. 22, 2011. As far as permitted, the contents of U.S. application Ser. No. 13/066,741 are incorporated herein by reference.

Additionally, in this embodiment, the reference system 236 includes a redirector assembly 244 that is used to provide the reference signal.

The light source assembly 240 generates one or more beams of light that are directed at the workpiece 200 and the redirector assembly 244. Further, the detector assembly 242 measures the light reflected off of the workpiece 200 and the redirector assembly 244. In FIG. 2A, the light source assembly 240 projects light that results in a sinusoidal irradiance pattern that includes a plurality of fringes of light 246 on the work piece 200 and the redirector assembly 244. In one embodiment, the light source assembly 240 includes (i) a light source 248A that generates light 248B, (ii) a lens 248C that collimates the light 248B from the light source 248A, (iii) a grating 248D that creates at least three plane waves (−1, 0, +1) for each wavelength, (iv) a lens 248E that focuses the light from the grating 248D, (v) an aperture plate 248F (illustrated in detail in FIG. 2B) that blocks the zero order plane wave and all higher orders while allowing the −1 and +1 waves to pass therethrough, and (iv) a lens 248G that directs the −1 and +1 waves onto the work piece 200 and the redirector assembly 244, where they create a sinusoidal irradiance pattern of light 246.

Additionally, as discussed in greater detail herein below, in certain embodiments, the light source 248A is a strobed light source that can generate and/or provide the light 248B in a strobed manner. As utilized herein, a strobed light source or a strobed light is one where one or more characteristics of the light 248B are changed over time in discrete increments (e.g., at time $t_0$, at time $t_1$, at time $t_2$, etc.). For example, in one embodiment, the wavelength (i.e. the color) of the light 248B can be changed over time such that different wavelengths (colors) or wavelength ranges of light 248B are generated at different discrete times. In one such, non-exclusive embodiment, the light source 248A can include four separate light emitting diodes ("LEDs") and each LED can generate light over a different wavelength range or wavelength spectrum. Thus, in such embodiment, the light 248B can include four different beams with each beam having a different wavelength range or wavelength spectrum. Additionally and/or alternatively, in one embodiment, the polarization of the light 248B can be changed over time such that different polarizations of light 248B are generated at different discrete times. Still alternatively, other characteristics of the light 248B can be changed at different discrete times.

It should be noted that the fringes of light 246 can be used to measure changes in the height of the work piece 200 because the phase of the fringes of light 246 changes as the height of the work piece 200 changes. The phase of the fringes of light 246 changes as the height of the work piece 200 changes due to such factors as the pitch of the sinusoidal irradiance pattern and the high angle of incidence of the fringes of light 246 impinging on the work piece 200.

In the embodiment illustrated in FIG. 2A, the grating 248D is imaged to the work piece 200 and the redirector assembly 244 via an afocal relay, and all wavelengths generated by the light source 248A create a fringe pattern with the same spatial frequency on the work piece 200 and the redirector assembly 244, and the plane waves for each wavelength have different angles relative to the optical axis (e.g., the Z axis) in the optical space near the work piece 200 and the redirector assembly 244. In this design, in the space between the lens 248E and the lens 248G, the beams from the multiple wavelengths are converging, focusing, and then diverging.

In one embodiment, (i) a first portion of the fringes of light 246, hereinafter referred to as measurement light 246A or measurement beam, is imaged onto the work piece 200; and (ii) a second portion of the fringes of light 246, hereinafter referred to as reference light 246B or reference beam, is projected onto the redirector assembly 244. In FIG. 2A, the fringes of the light 246 that are farthest out of the page along the Y axis is the reference light 246B, while the fringes of light 246 that are into the page along the Y axis is the measurement light 246A. With this design, the redirector assembly 244 picks off and redirects some of the fringes of light 246 before they are imaged onto the work piece 200.

The detector assembly 242 detects the measurement light 246A that is reflected off of the work piece 200 and the reference light 246B that is reflected off of the redirector assembly 244. In one embodiment, the detector assembly 242 includes (i) a lens 250A that focuses the measurement light 246A that is reflected off of the work piece 200 and the reference light 246B that is reflected off of the redirector assembly 244, (ii) an aperture 250B that blocks light diffracted by the patterns that exist on the wafer, (iii) a lens 250C that focuses the light that passes from the aperture 250B, and (iv) a detector 250D. With this design, the same detector 250D is used to measure both the measurement light 246A that is reflected off of the work piece 200 and the reference light 246B that is reflected off of the redirector assembly 244. Thus, the detector 250D can provide to the control system 224 a measurement signal that relates to the measurement light 246A that is reflected off of the work piece 200 and a reference signal that relates to the reference light 246B that is reflected off of the redirector assembly 244. In some embodiments, the detector 250D is a charge-coupled device. For example, in one such embodiment, the detector 250D can be a chromatic, time domain integration ("TDI") charge-coupled device ("CCD").

As noted above, in certain embodiments, the light source 248A can be a strobed light source that can generate and/or provide the light 248B in a strobed manner. With this design, the detector 250D can be utilized to provide the measurement signal and the reference signal to the control system 224 in an alternating manner. Stated in another fashion, the measurement signal and the reference signal can be effectively strobed in time as the light source 248A is able to alternatingly provide the measurement light 246A (i.e. that is reflected off of the work piece 200) and the reference light 246B (i.e. that is reflected off of the redirector assembly 244) that are reflected and/or redirected toward the detector 250D.

Additionally, in some embodiments, the light, i.e. the measurement light 246A and the reference light 246B, that is incident on the detector 250D can be directed at the detector 250D so as to have a grazing angle of incidence of between approximately thirty and eighty degrees relative to the detector normal. Additionally, the grazing angle of incidence can be fixed for a given design (i.e. the angle does not vary for a given fringe projection system). Moreover, as illustrated, the grazing angle of incidence is about the Y-axis. Alternatively, the light, i.e. the measurement light 246A and the reference light 246B, that is incident on the detector 250D can be directed at the detector 250D at a different angle.

As provided herein, the reference signal relates to the measurement of everything that is changing in the autofocus system 222 except for the position of the work piece 200 along the Z axis, and the measurement signal relates to the measurement of everything changing in the autofocus system 222 including the position of the work piece 200 along the Z axis. With this design, the control system 224 can subtract the reference signal from the measurement signal to determine the position of the work piece 200 along the Z axis.

In one embodiment, the redirector assembly 244 includes a first redirector 252 and a second redirector 254. These components are described in more detail below in reference to FIGS. 3A-3C. In one non-exclusive embodiment, the first redirector 252 and the second redirector 254 can be fixedly secured to the optical assembly 16 (illustrated in FIG. 1) with a redirector bracket 55 (illustrated in FIG. 1). Alternatively, the first redirector 252 and the second redirector 254 may be fixedly secured to the support frame which supports the optical assembly 16.

It should be noted that the present embodiment can be designed for use without the reference assembly.

Figure 2B:
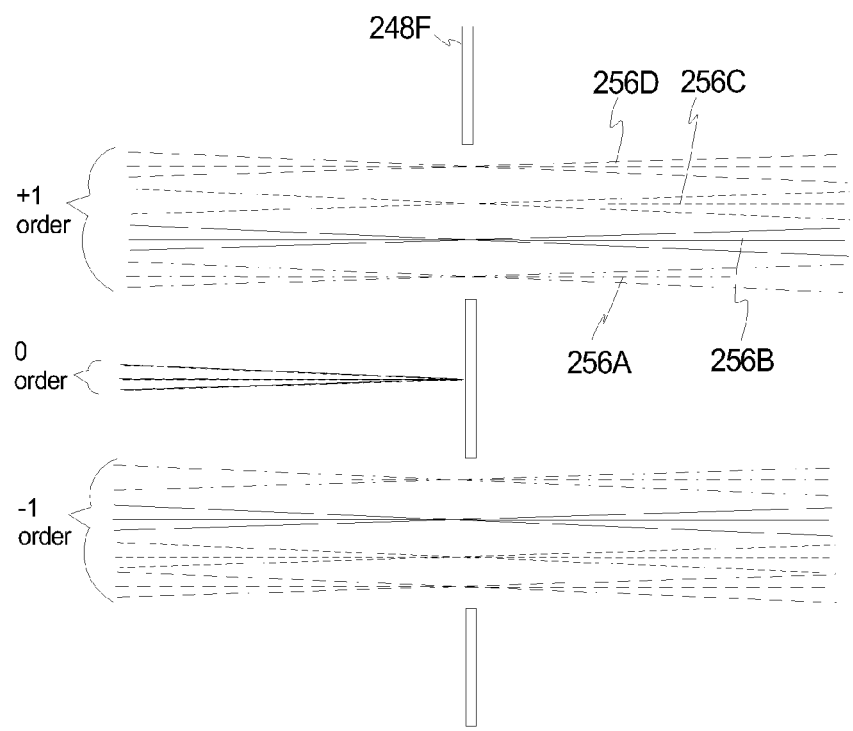
FIG. 2B is a simplified illustration of an aperture plate that controls which orders are directed at a working surface of the work piece to create the continuous fringe pattern of light from FIG. 2A.

FIG. 2B is a simplified illustration of the aperture plate 248F and the light diffracted by the grating 248D that has been focused by the lens 248E in the plane of the aperture plate 248F from FIG. 2A. This Figure illustrates that four separate wavelength beams 256A, 256B, 256C, 256D, each with a −1, 0, +1 order plane wave, are focused in the plane of the aperture plate 248F, and that the aperture plate 248F blocks the zero order light for each of the beams 256A, 256B, 256C, 256D, while the +1 order light and the −1 order light for each of the beams 256A, 256B, 256C, 256D are allowed to pass the aperture plate 248D. In this embodiment, two orders (e.g., the +1, −1) for three of the beams 256A, 256B, 256C are directed at the work piece 200, and two orders (e.g., the +1, −1) of the fourth beam 256D are directed at the redirector assembly 244.

Figure 3A:
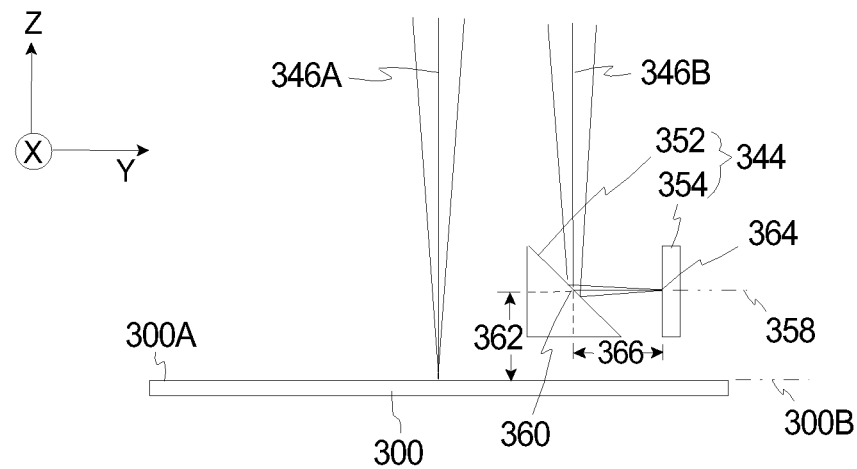
FIG. 3A is a simplified side illustration of the work piece, and an embodiment of a measurement light, a reference light, and a redirector assembly.
Figure 3B:
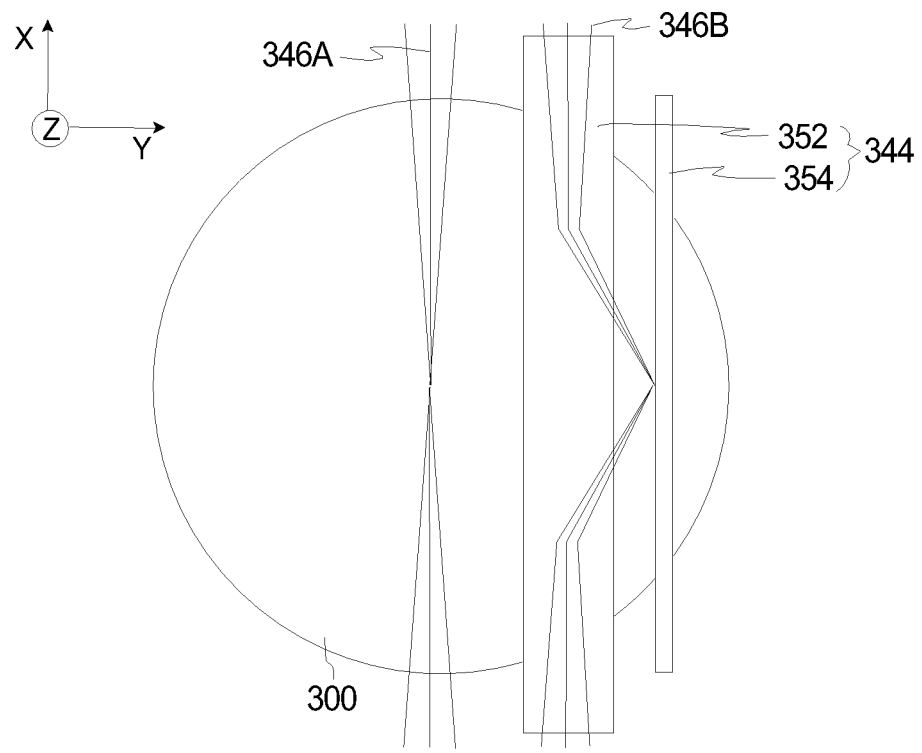
FIG. 3B is a simplified top illustration of the work piece, the measurement light, the reference light, and the redirector assembly of FIG. 3A.
Figure 3C:
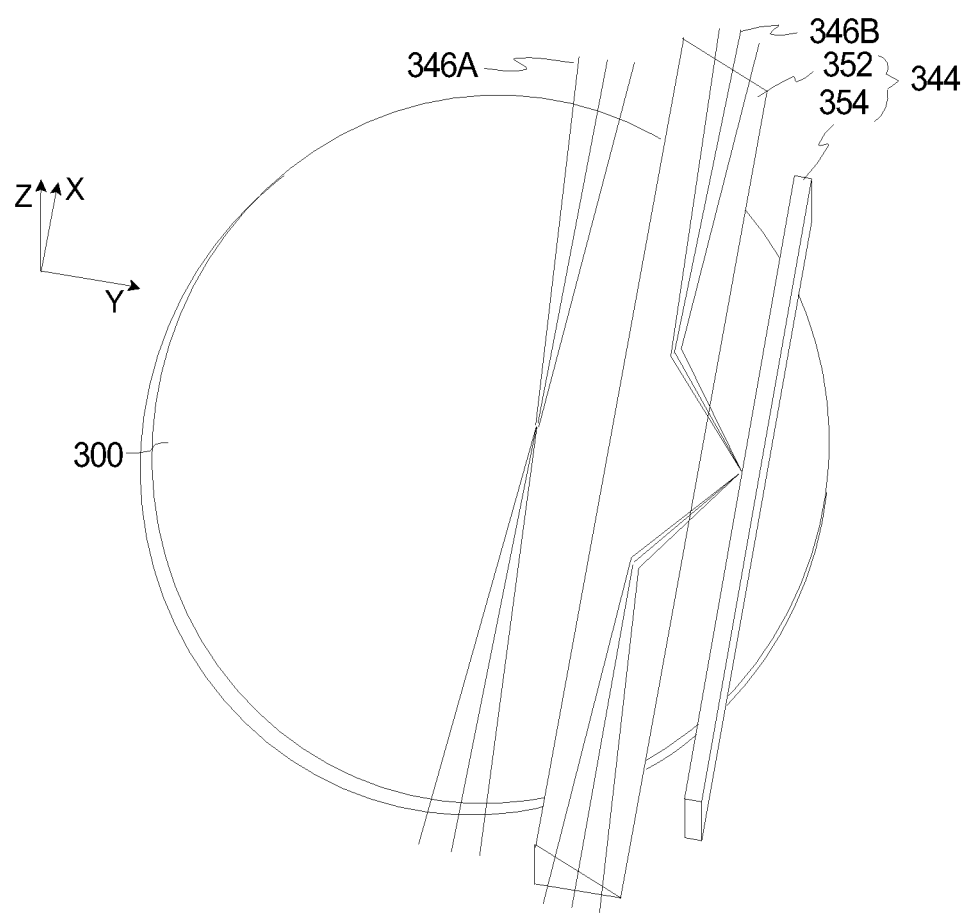
FIG. 3C is a simplified top perspective illustration of the work piece, the measurement light, the reference light, and the redirector assembly of FIG. 3A.

FIG. 3A is a simplified side illustration, FIG. 3B is a simplified top illustration, and FIG. 3C is a simplified top perspective view of the work piece 300, the measurement light 346A directed at the work piece 300, the reference light 346B directed at the redirector assembly 344, and one embodiment of the first redirector 352 and the second redirector 354 of the redirector assembly 344. As illustrated in these Figures, the reference light 346B can be displaced and spaced apart along the Y axis (the wafer scan direction) from the measurement light 346A prior to the measurement light 346A being incident on the work piece 300 and the reference light 346B being incident on the first redirector 352.

In this embodiment, (i) the reference light 346B from the light source assembly 240 (illustrated in FIG. 2A) is directed at the first redirector 352, (ii) the first redirector 352 redirects the reference light 346B at the second redirector 354, (iii) the second redirector 354 redirects the reference light 346B back to the first redirector 352, and (iv) the first redirector 352 redirects the reference light 346B back to the detector assembly 242 (illustrated in FIG. 2A).

In one embodiment, the first redirector 352 is a fold mirror that redirects the reference light 346B at an angle relative to the input light. With this design, the first redirector 352 folds the reference light 346B into a beam plane 358 that is approximately parallel to, spaced apart from, and positioned above a working surface plane 300B of the working surface 300A of the work piece 300. In certain embodiments, the first redirector 352 redirects the reference light 346B out of the XZ plane. The XZ plane may be regarded as a first plane in which the measurement beam traveled. For example, the first redirector 352 can be made from glass, in the shape of a long, right triangle prism (e.g., a long prism with a right triangular shaped cross-section). Alternatively, the first redirector 352 can be made from metal, with the hypotenuse highly polished. This would allow for easier mounting of the first redirector 352. Still alternatively, the first redirector 352 can include a mirror mounted to a metal mount, again for easier mounting. In one non-exclusive embodiment, the first redirector 352 has a width of approximately five millimeters.

As illustrated in FIG. 3A, a center of the reference light 346B is incident on the first redirector 352 at a first redirector area 360, and the first redirector area 360 is positioned a first separation distance 362 away from the working surface 300A along the Z axis. In alternative, non-exclusive embodiments, the first separation distance 362 can be approximately 1.5, 2.0, 2.5, or 3.0 millimeters.

The second redirector 354 can be a reflector or mirror that is positioned away from the first redirector 352 along the beam plane 358 (e.g., along the Y axis) such that it is optically coincident with the working surface 300A of the work piece 300. With this design, the second redirector 354 reflects the reference light 346B back to the first redirector 352 along the beam plane 358 that is parallel to, and spaced apart from the working surface plane 300B. Further, the reference light 346B is incident on the second redirector 354 at a second redirector area 364 positioned on the beam plane 358, and the second redirector area 364 is spaced apart a second separation distance 366 from the first redirector area 360 along the beam plane 358. Moreover, in certain embodiments, the second separation distance 366 is equal to or approximately equal to the first separation distance 362. This is important because the second redirector 354 is not defocused relative to the working surface 300A of the work piece 300. Stated in another fashion, when the second separation distance 366 is equal to the first separation distance 362, the reference light 346B travels the same distance via the redirectors 352, 354 as it would have if it was instead incident on the working surface 300A. As a result thereof, the same detector assembly 242 can be used for both the measurement light 346A and the reference light 346B. This simplifies the receiving side optics.

In one non-exclusive embodiment, the second redirector 354 can be made from glass, in the shape of a long rectangular bar. Alternatively, the second redirector 354 can be made from metal, with a side that is highly polished. This would allow for easier mounting of the second redirector 354. Still alternatively, the second redirector 354 can include a mirror mounted to a metal mount, again for easier mounting.

In certain embodiments, the reference light 346B is incident at a grazing angle of incidence to the first redirector 352. For this reason, the first redirector 352 may be required to be quite long, depending on the size of the first separation distance 362, the numerical aperture of the reference light 346B, and the length of the second redirector 354. Generally, the smaller the first separation distance 362, the smaller the length that the first redirector 352 is required to be. As non-exclusive examples, the first redirector 352 and the second redirector 354 can be approximately 350, 400, 450 or more millimeters in length (L).

In this embodiment, the reference light 346B is not perfectly collinear with the measurement light 346A. However, the reference light 346B will still provide a high degree of correction, because the lateral displacement (along the Y axis in this example) is not much and the reference light 346B goes through all the same components of the light source assembly 240 and the detector assembly 242.

Importantly, in the design described above, the reference light 346B does not travel through one or more prisms (not shown). The problem with using one or more prisms is that it will add a glass path and dispersion that will only be in the path of the reference light 346B and not in the path of the measurement light 346A. This makes it difficult for the reference and measurement lights to have equivalent optical paths. Thus, in certain embodiments, the proposed autofocus system 222 (illustrated in FIG. 2A) has no glass path to introduce a different level of dispersion in the reference light 346B when compared to the measurement light 346A.

Figure 4A:
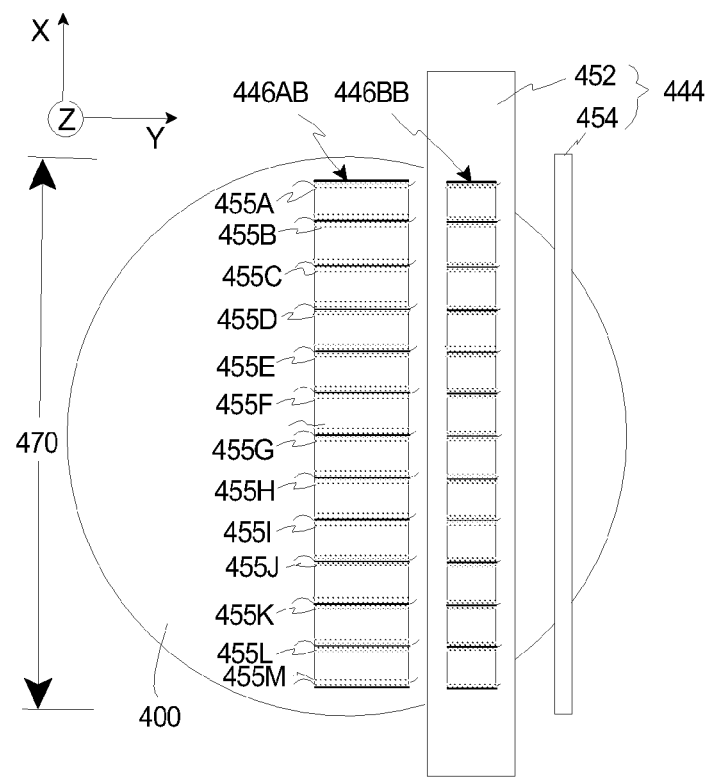
FIG. 4A is a simplified top illustration of the work piece, and another embodiment of a measurement light, a reference light, and a portion of a redirector assembly.
Figure 4B:
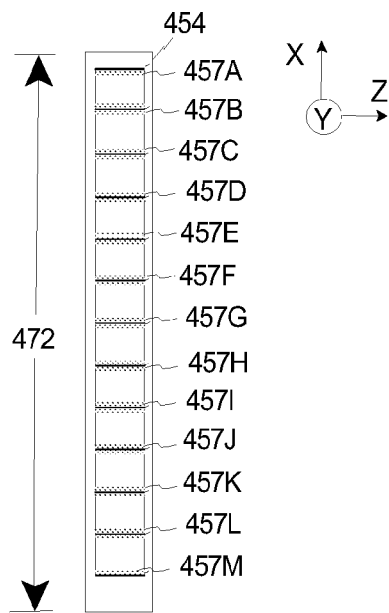
FIG. 4B is a simplified side view of a second redirector of the redirector assembly of FIG. 4A.

FIG. 4A is a simplified top illustration of the work piece 400, the first redirector 452 and the second redirector 454 of the redirector assembly 444, an embodiment of the measurement light 446AB imaged on the work piece 400, and an embodiment of the reference light 446BB directed at the first redirector 452. Additionally, FIG. 4B is a side view of the second redirector 454 of FIG. 4A. In this embodiment, (i) the light source assembly 240 (as illustrated in FIG. 2A) generates a plurality of fringes of light, (ii) a first portion of the fringes of light (referred to as the measurement light 446AB) are concurrently directed at and reflected off of the work piece 400, and (iii) a second portion of the fringes of light (referred to as the reference light 446BB) are concurrently directed at and reflected off of the redirector assembly 444. It should be noted that the reference light 446BB will actually be significantly defocused on the first redirector 452 and will not appear as a plurality of fringes of light on the first redirector 452.

Moreover, in this embodiment, (i) the measurement light 446AB is simultaneously imaged onto the work piece 400 at a plurality of measurement areas 455A-455M positioned along the X axis, and the detector assembly 242 (illustrated in FIG. 2A) detects the measurement light 446AB reflected off of the work piece 400 and generates a measurement signal for each of the measurement areas 455A-455M; and (ii) the reference light 446BB is simultaneously imaged onto the second redirector 454 at a plurality of reference areas 457A-457M positioned along the X axis, and the detector assembly 242 detects the reference light 446BB reflected off of the second redirector 454 and generates a reference signal for each of the reference areas 457A-457M. Additionally, in this embodiment, (i) the work piece 400 has a surface length 470 measured along the X axis; (ii) the plurality of measurement areas 455A-455M are positioned along substantially the entire surface length; and (iii) the reference areas 457A-457M are positioned along a reference length 472 that is approximately equal to the surface length 470. With this design, the reference areas 457A-457M are near the measurement areas 455A-455M, and the many reference areas 457A-457M that are spread along the surface length 470 correspond, one to one, to the many measurement areas 455A-455M, such that every measurement area 455A-455M has a corresponding, unique reference area 457A-457M.

In this embodiment, the measurement light 446AB is substantially continuous across the work piece 400, and the reference light 446BB is substantially continuous along the redirector assembly 444. In this embodiment, the parsing into individual measurement areas 455A-455M and individual reference areas 457A-457M happens with the spatial discretization at the detector (not shown in FIGS. 4A and 4B). Thus, with this system, there is a plurality of discrete measurement areas 455A-455M and a plurality of discrete reference areas 457A-457M.

The number of measurement areas 455A-455M and the number of reference areas 457A-457M can be varied. In certain embodiments, as noted above, the system is designed so that every measurement area 455A-455M has a corresponding reference area 457A-457M. With this design, a reference signal is generated for each measurement signal, and there is a one to one ratio of measurement signals and reference signals. Stated in another fashion, in such embodiments, there is a separate, independent, corresponding reference signal for each measurement signal. As provided herein, with this design, the control system 224 (illustrated in FIG. 2A) can utilize simple subtraction between each corresponding reference signal and measurement signal for processing. For example, the control system 224 can (i) subtract the first reference signal from the first measurement signal to determine the position of the work piece 400 at the first measurement area 455A; (ii) subtract the second reference signal from the second measurement signal to determine the position of the work piece 400 at the second measurement area 455B; and (iii) subtract the third reference signal from the third measurement signal to determine the position of the work piece 400 at the third measurement area 455C. This process is repeated to determine the position of each of the measurement areas 455A-455M.

It should be noted that (i) any of the measurement areas 455A-455M can be referred to as a first, second, third, etc. measurement area 455A-455M, (ii) the corresponding measurement signals can be referred to as a first, second, third, etc. measurement signal, (iii) any of the reference areas 457A-457M can be referred to as a first, second, third, etc. reference area 457A-457M, and (iv) the corresponding reference signals can be referred to as a first, second, third, etc. reference signal. Further, in certain embodiments, each corresponding measurement area 455A-455M and reference area 457A-457M are approximately aligned along the Y axis.

Figure 5A:
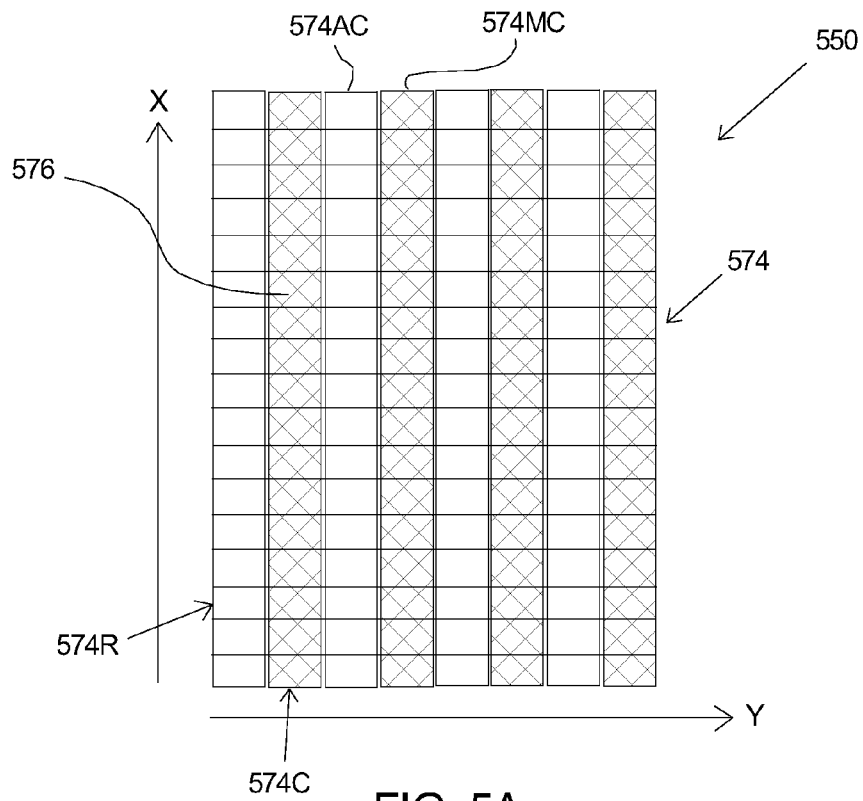
FIG. 5A is a simplified schematic illustration of an embodiment of a detector.

FIG. 5A is a simplified schematic illustration of an embodiment of a detector 550 that is usable as part of the autofocus system 222 (illustrated in FIG. 2A). The design of the detector 550 can be varied to suit the specific requirements of the autofocus system 222. For example, in one embodiment, as illustrated in FIG. 5A, the detector 550 can be a chromatic, TDI CCD that can be used with a fringe projection type autofocus system that is used to measure the position of a work piece, e.g., a wafer 28 (illustrated in FIG. 1). Alternatively, the detector 550, i.e. the TDI CCD, can be used in another type of system.

As provided herein, for a fringe projection type AF system, it is essential that different spectral bands are measured for the same location on the wafer 28. The present embodiment allows this to be done using a modified TDI CCD detector 550.

A TDI CCD detector, such as being used as part of the present embodiment, transfers a charge across the front of the CCD in a TDI direction (e.g., left to right in FIG. 5A) synchronously to the image motion, as such devices are typically used with a moving object. This allows a brighter image to be obtained for a given amount of irradiance (power per unit area). For example, in the embodiment shown in FIG. 5A, the +Y direction can be defined as the TDI direction. Accordingly, in such embodiment, the X direction would be perpendicular to the TDI direction. Thus, in this embodiment, the charge is transferred from left to right as illustrated in FIG. 5A. Additionally, TDI CCD detectors can be used with a moving object.

As illustrated in FIG. 5A, the detector 550 includes a rectangular array of pixels 574 comprising a plurality of rows of pixels 574R (each row extends from left to right in FIG. 5A, i.e. in the +Y direction) and a plurality of columns of pixels 574C (each column extends from top to bottom in FIG. 5A, i.e. in the −X direction). It should be noted that the number of pixels 574, the number of rows of pixels 574R, and the number of columns of pixels 574C specifically illustrated in FIG. 5A is for purposes of demonstration only, and is not necessarily representative of a desired number of pixels 574, rows of pixels 574R and/or columns of pixels 574C. More particularly, the number of pixels 574, rows of pixels 574R and/or columns of pixels 574C can be varied as desired. For example, in one non-exclusive embodiment, the detector 550 can include 8192 rows of pixels 574R. Alternatively, the detector 550 can include greater than or less than 8192 rows of pixels 574R.

Additionally, as illustrated, the detector 550 includes a plurality of masks 576 that are fixed relative to the pixels 574 and that extend over and cover entire columns of pixels 574C. With this design, the detector 550 includes a plurality of active columns 574AC (i.e. uncovered or unmasked columns, shown in white), and a plurality of masked columns 574MC (shown in black). As illustrated, the plurality of active columns 574AC and the plurality of masked columns 574MC are each arranged along a first direction (i.e. the vertical direction as illustrated in FIG. 5A). In certain embodiments, at least every other column of pixels 574C is covered by one of the plurality of masks 576, such that no active columns 574AC are positioned adjacent to another active column 574AC, i.e. each of the active columns 574AC is spaced apart from each of the other active columns 574AC in a second direction (i.e. the horizontal direction in FIG. 5A) that is substantially orthogonal to the first direction, with at least one masked column 574MC positioned therebetween. Stated in another manner, in such embodiments, no two active columns 574AC are positioned adjacent to one another along the second direction.

In the embodiment illustrated in FIG. 5A, the active columns 574AC and the masked columns 574MC alternate, such that there is one masked column 574MC for every active column 574AC. Thus, except for the end columns, a single masked column 574MC is positioned between two active columns 574AC, and a single active column 574AC is positioned between two masked columns 574MC. Alternatively, more than one masked column 574MC can be positioned between the active columns 574AC. For example, in certain non-exclusive alternative embodiments, the detector 550 can include two, three, four or five masked columns 574MC for every active column 574AC.

The type of mask used for each masked column 574MC can be varied according to the characteristics of the light. For example, the mask can be made of a material that inhibits and blocks the transmission of the light. Suitable materials for the mask include aluminum and silver.

Further, with the unique design of the detector 550, as provided herein, a charge is initially generated from light, e.g., light 248B (illustrated in FIG. 2A) from the light source 248A (illustrated in FIG. 2A), impinging on a first active column of pixels 574AC, i.e. the left-most active column 574AC in FIG. 5A. The charge is then transferred to the adjacent masked column of pixels 574MC, and subsequently the charge is transferred to the adjacent active column of pixels 574AC. The process of transferring the charge in such a manner is continued until the charge reaches the right end of the array of pixels 574, i.e. the right-most column of pixels 574C. Ultimately, an output charge, e.g., the charge that gets digitized in a digital camera, is generated due to an accumulation of charge from the light 248B impinging on each of the active columns of pixels 574AC as the light 248B and/or charge is transferred from left-to-right, i.e. in the TDI direction, across the array of pixels 574.

Moreover, the detector 550 can include a wire (not illustrated for purposes of clarity) that is coupled and/or secured to an end of each row of pixels 574R so as to effectively capture a signal, e.g., an analog signal, for each row of pixels 574R as a function of time, as the pixels 574 shift to the right (in the +Y direction as illustrated in FIG. 5A) over time. Thus, in this embodiment, the signal for each row of pixels 574R is captured and/or read at the right end of the row of pixels 574R.

The analog signal on this wire is converted to a digital signal using an analog to digital converter (ADC).

Figure 5B:
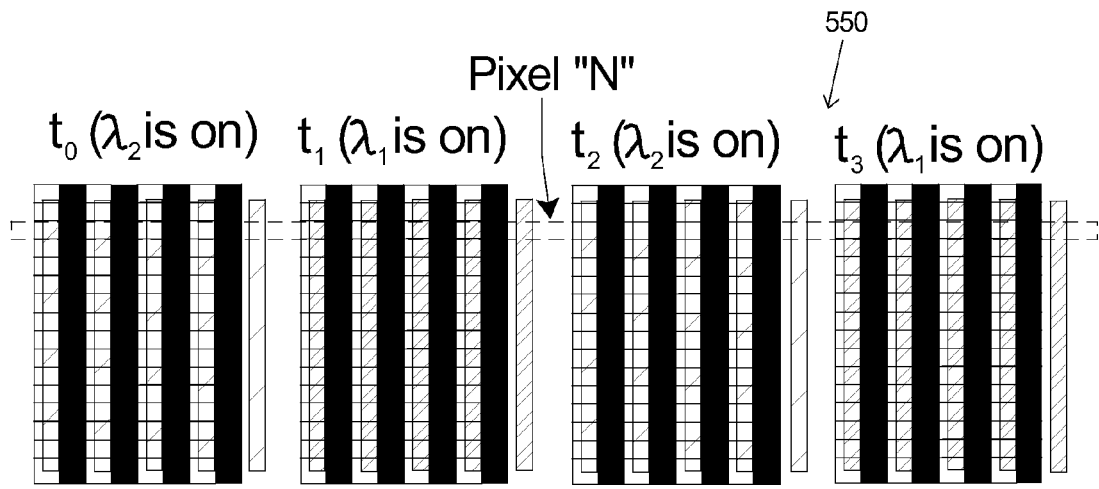
FIG. 5B illustrates the image recorded by active pixels of the detector of FIG. 5A over time.

FIG. 5B illustrates the image recorded by the active columns of the detector 550 of FIG. 5A over time. In particular, FIG. 5B shows the image recorded by those active pixels for times $t_0$ through $t_3$ as the light source 248A (illustrated in FIG. 2A) provides light 248B (illustrated in FIG. 2A) to illuminate the detector 550. In one embodiment, the light source 248A effectively illuminates the pixels on the detector 550.

In one embodiment, as provided above, the light source 248A is strobed, such that the wavelength (or wavelength range) of the light 248B provided by the light source 248A can be selectively adjusted in discrete increments over time. Stated another way, the wavelength (or wavelength range) of the light 248B provided by the light source 248A can be strobed for times $t_0$, $t_1$, $t_2$, $t_3$, etc. For example, as shown in FIG. 5B, at time $t_0$, the light source 248A provides light at wavelength $\lambda_2$ (i.e. $\lambda_2$ is on); at time $t_1$, the light source 248A provides light at wavelength $\lambda_1$ (i.e. $\lambda_1$ is on); at time $t_2$, the light source 248A provides light at wavelength $\lambda_2$ (i.e. $\lambda_2$ is on); at time $t_3$, the light source 248A provides light at wavelength $\lambda_1$ (i.e. $\lambda_1$ is on); etc. Additionally and/or alternatively, other characteristics of the light 248B generated by the light source 248A can be selectively adjusted in discrete increments over time. For example, the polarization and/or other characteristics of the light 248B generated by the light source 248A can be adjusted in discrete increments over time.

Moreover, the rate at which the light source 248A is strobed can vary depending on the overall capabilities of the system. For example, in one non-exclusive embodiment, the light source 248A is strobed at a rate of sixty-eight kHz (or 68,000 lines per second). Alternatively, the light source 248A can be strobed at a different rate that is greater than or less than sixty-eight kHz.

Further, it should be noted that as the number of masked columns 574MC per active column 574AC increases, the number of different wavelengths, wavelength ranges, polarizations, etc. of light 248B that can be used also increases. For example, in the embodiment illustrated in FIGS. 5A and 5B, with one masked column 574MC per active column 574AC, two different wavelengths, wavelength ranges, and/or polarizations, etc. of light 248B can be used from the light source 248A. Alternatively, in certain non-exclusive alternative embodiments, if the detector 550 includes two masked columns for each active column, up to three different wavelengths, wavelength ranges, and/or polarizations, etc. of light 248B can be used from the light source 248A; if the detector 550 includes three masked columns for each active column, up to four different wavelengths, wavelength ranges, and/or polarizations, etc. of light 248B can be used from the light source 248A; if the detector 550 includes four masked columns for each active column, up to five different wavelengths, wavelength ranges, and/or polarizations, etc. of light 248B can be used from the light source 248A; and if the detector 550 includes five masked columns for each active column, up to six different wavelengths, wavelength ranges, and/or polarizations, etc. of light 248B can be used from the light source 248A.

It should be further noted that the purpose of the masked columns 574MC (illustrated in FIG. 5A) of pixels is to shield the $\lambda_1$ signal from $\lambda_2$ light when $\lambda_2$ is on, and vice versa at the next TDI clock cycle.

Additionally, for purposes of demonstrating the output of the present embodiment, FIG. 5B further isolates a single pixel (i.e. in the X direction) and labels that as Pixel "N" (shown as a dashed rectangular box).

Figure 5C:
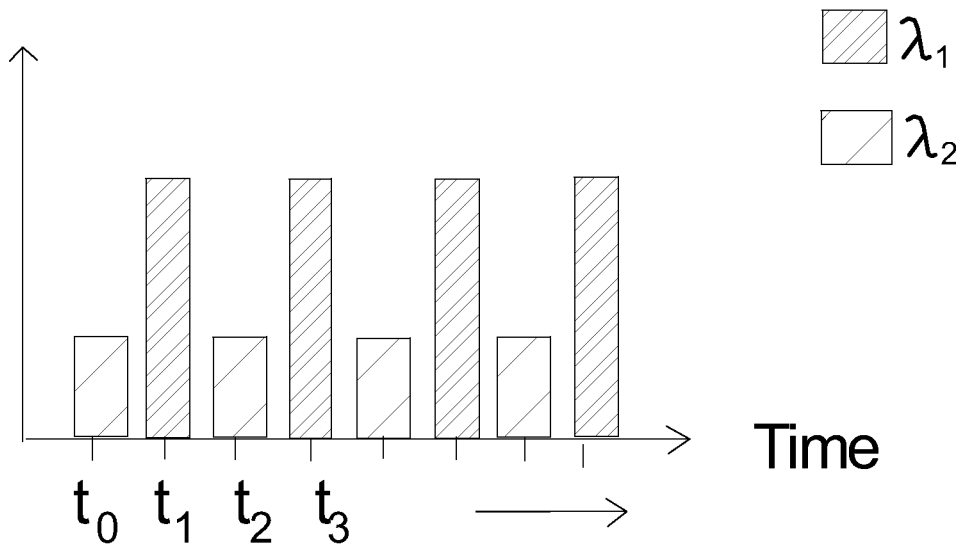
FIG. 5C illustrates the output signal for a single pixel of the detector of FIG. 5A over time.

FIG. 5C illustrates the output signal for a single pixel, i.e. Pixel "N", of the detector 550 of FIGS. 5A and 5B over time. In this case, every other data point in time corresponds to $\lambda_1$, while the other interleaved set of data points corresponds to $\lambda_2$. Assuming the object (in the FP AF system this can be the wafer 28 (illustrated in FIG. 1)) is moving synchronously to the charge transfer, the result is two images of nearly the same locations on the wafer 28 in x and y interleaved in time. The extent to which the two images are the same depends on the characteristics of the entire optical system, including the optics resolution, for example. The two images are then combined to accurately determine the position of the wafer 28. Stated another way, in this embodiment, the values measured at a particular location from each of the different wavelengths of light can be combined, e.g., by the control system 224 (illustrated in FIG. 2A), to accurately determine the position of the wafer 28. Additionally, it should be noted that the output signal that is provided from the detector 550 depends on the fringe phase for each wavelength that is provided by the light source 248A (illustrated in FIG. 2A), with the fringe phase varying as the position, i.e. the height, of the wafer 28 varies. It should be noted that it is not a requirement that the object is moving synchronously to the charge transfer in the TDI region. In the case where the object is not synchronized to the charge transfer, the locations measured on the object by the two images are slightly different. This difference depends on the resolution of the optical system of FIG. 2A, along with other system parameters.

Figure 6:
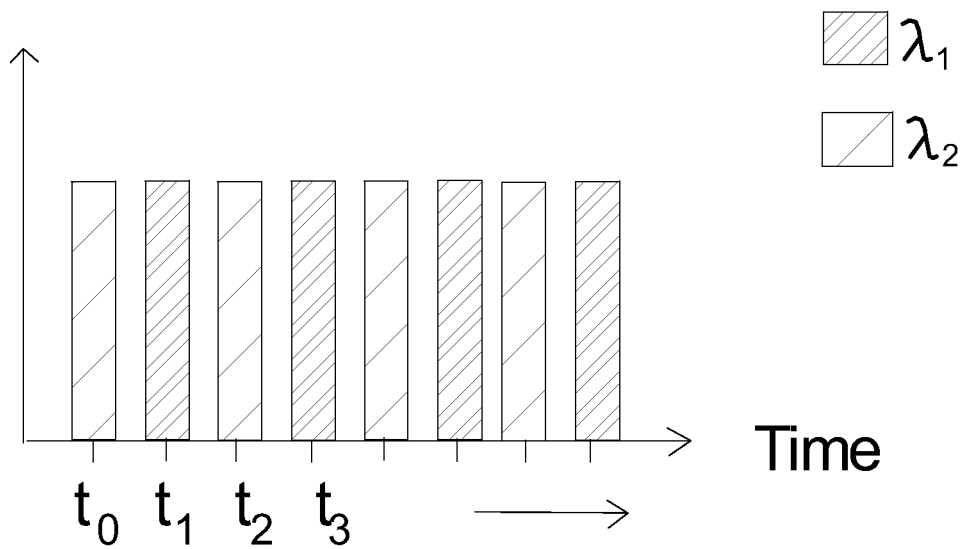
FIG. 6 is a graphical illustration of light from a source power as a function of time.

FIG. 6 is a graphical illustration of the light 248B from the source power, i.e. the source irradiance or light source 248A (illustrated in FIG. 2A), as a function of time. More specifically, FIG. 6 graphically illustrates that at time $t_0$, the light has a wavelength of $\lambda_2$; at time $t_1$, the light has a wavelength of $\lambda_1$; at time $t_2$, the light has a wavelength of $\lambda_2$; at time $t_3$, the light has a wavelength of $\lambda_1$; etc. In one non-exclusive embodiment, the light source 248A can be strobed at a rate of sixty-eight kHz (or 68,000 lines per second). Alternatively, the light source 248A can be strobed at a different rate, i.e. at a rate higher or lower than sixty-eight kHz.

Figure 7A:
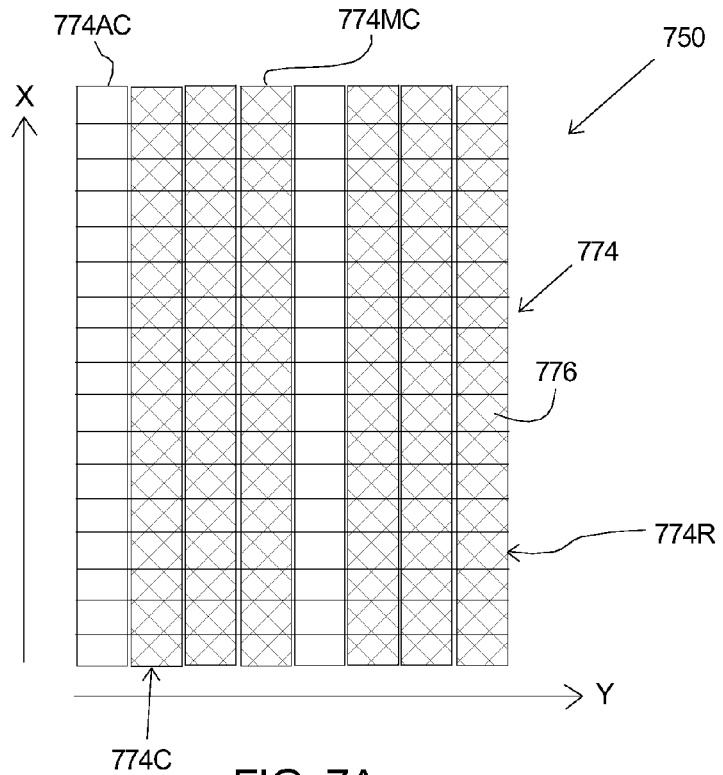
FIG. 7A is a simplified schematic illustration of another embodiment of a detector.

FIG. 7A is a simplified schematic illustration of another embodiment of a detector 750. The detector 750 is somewhat similar to the detector 550 illustrated and described above in relation to FIG. 5A. In particular, the detector 750 can again be a chromatic, TDI CCD that can be used with a fringe projection type autofocus system, e.g., the autofocus system 222 (illustrated in FIG. 2A), that is used to measure the position of a work piece, e.g., a wafer 28 (illustrated in FIG. 1). Additionally, the detector 750 again includes a rectangular array of pixels 774 comprising a plurality of rows of pixels 774R (each row extends from left to right in FIG. 7A, i.e. in the +Y direction) and a plurality of columns of pixels 774C (each column extends from top to bottom in FIG. 7A, i.e. in the −X direction). Further, the detector 750 again includes a plurality of masks 776 that are fixed relative to the pixels 774 and that extend over and cover entire columns of pixels 774C. With this design, the detector 750 includes a plurality of active columns 774AC (i.e. uncovered or unmasked columns, shown in white)), and a plurality of masked columns 774MC (shown in black).

However, in this embodiment, there are three masked columns 774MC for every active column 774AC. This allows up to four different spectral signals to be collected using a single TDI chip.

Further, in this embodiment, a charge is initially generated from light, e.g., light 248B (illustrated in FIG. 2A) from the light source 248A (illustrated in FIG. 2A), impinging on a first active column of pixels 774AC, i.e. the left-most active column 774AC in FIG. 7A. The charge is then transferred to the three adjacent masked columns of pixels 774MC, and subsequently the charge is transferred to the adjacent active column of pixels 774AC. The process of transferring the charge in such a manner is continued until the charge reaches the right end of the array of pixels 774, i.e. the right-most column of pixels 774C. Ultimately, an output charge is generated due to an accumulation of charge from the light 248B impinging on each of the active columns of pixels 774AC as the light 248B and/or charge is transferred from left-to-right, i.e. in the TDI direction, across the array of pixels 574.

Figure 7B:
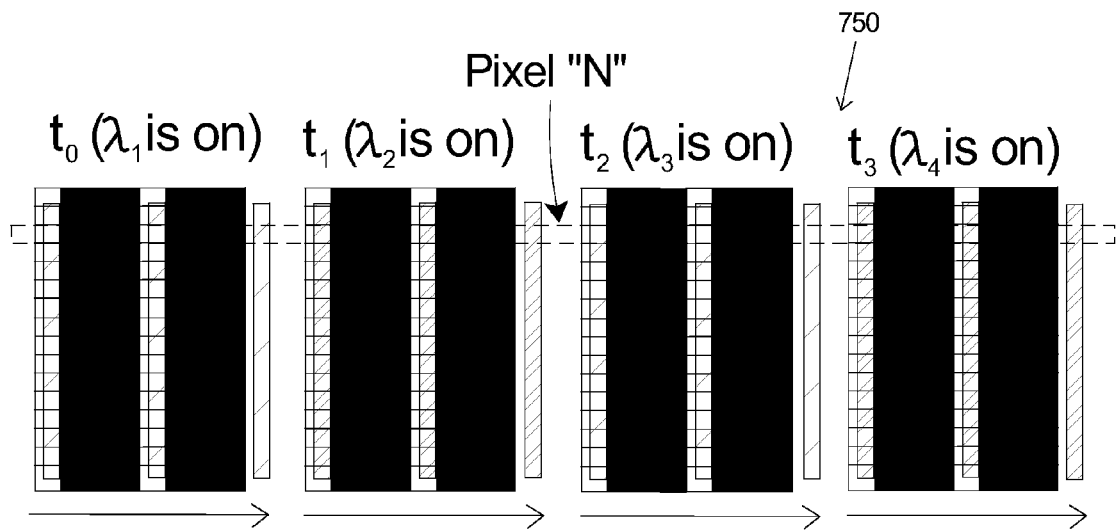
FIG. 7B illustrates the image recorded by active pixels of the detector of FIG. 7A over time.

FIG. 7B illustrates the image recorded by active columns of the detector 750 of FIG. 7A over time. In particular, FIG. 7B shows the image recorded by those active pixels for times $t_0$ through $t_3$ as the light source 248A (illustrated in FIG. 2A) provides light 248B (illustrated in FIG. 2A) to illuminate the detector 750.

Similar to the previous embodiment, the light source 248A (illustrated in FIG. 2A) is again strobed, such that the wavelength of the light provided by the light source 248A is selectively adjusted in discrete increments over time. Stated another way, the wavelength of the light provided by the light source 248A can be strobed for times $t_0$, $t_1$, $t_2$, $t_3$, etc. For example, as shown in FIG. 7B, at time $t_0$, the light source 248A provides light at wavelength $\lambda_1$ (i.e. $\lambda_1$ is on); at time $t_1$, the light source 248A provides light at wavelength $\lambda_2$ (i.e. $\lambda_2$ is on); at time $t_2$, the light source 248A provides light at wavelength $\lambda_3$ (i.e. $\lambda_3$ is on); at time $t_3$, the light source 248A provides light at wavelength $\lambda_4$ (i.e. $\lambda_4$ is on); etc. Additionally and/or alternatively, other characteristics of the light 248B generated by the light source 248A can be selectively adjusted in discrete increments over time. For example, the polarization and/or other characteristics of the light 248B generated by the light source 248A can be adjusted in discrete increments over time.

Moreover, the rate at which the light source 248A is strobed can vary depending on the overall capabilities of the system. For example, in one non-exclusive embodiment, the light source 248A is strobed at a rate of sixty-eight kHz (or 68,000 lines per second). Alternatively, the light source 248A can be strobed at a different rate that is greater than or less than sixty-eight kHz.

Additionally, for purposes of demonstrating the output of the present embodiment, FIG. 7B again isolates a single pixel (i.e. in the X direction) and labels that as Pixel "N" (shown as a dashed rectangular box).

Figure 7C:
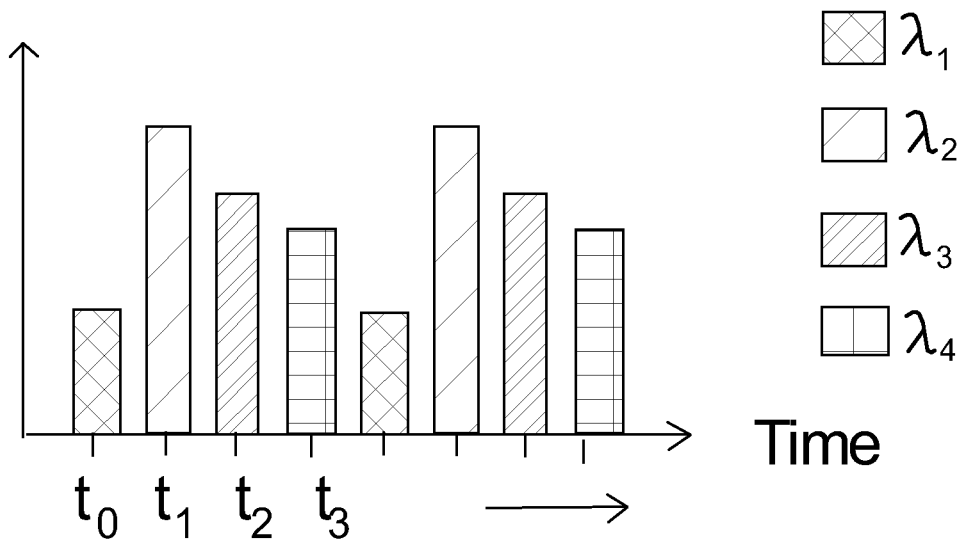
FIG. 7C illustrates the output signal for a single pixel of the detector of FIG. 7A over time.

FIG. 7C illustrates the output signal for a single pixel, i.e. Pixel "N" of the detector 750 of FIGS. 7A and 7B over time. In this case, the data points correspond consecutively to $\lambda_1$, $\lambda_2$, $\lambda_3$ and $\lambda_4$, with the pattern repeating itself over time. Assuming the object (in the FP AF system this is the wafer 28 (illustrated in FIG. 1)) is moving synchronously to the charge transfer, the result is four images of nearly the same locations on the wafer 28 in x and y interleaved in time. The four images are then combined to accurately determine the position of the wafer 28. Stated another way, in this embodiment, the values measured at a particular location from each of the different wavelengths of light can be combined, e.g., by the control system 224 (illustrated in FIG. 2A), to accurately determine the position of the wafer 28. Additionally, it should be noted that the output signal that is provided from the detector 750 depends on the fringe phase for each wavelength that is provided by the light source 248A (illustrated in FIG. 2A), with the fringe phase varying as the position, i.e. the height, of the wafer 28 varies. It should be noted that it is not a requirement that the object is moving synchronously to the charge transfer in the TDI region. In the case where the object is not synchronized to the charge transfer, the locations measured on the object by the multiple images are slightly different. This difference depends on the resolution of the optical system of FIG. 2A, along with other system parameters.

Figure 8A:
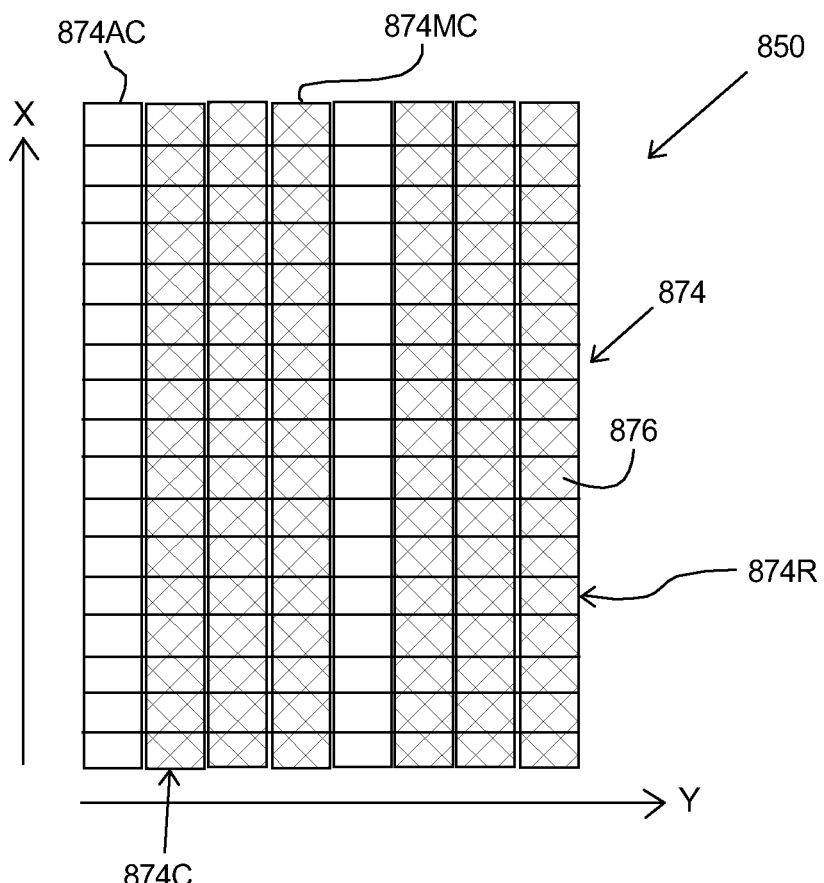
FIG. 8A is a simplified schematic illustration of still another embodiment of a detector.

FIG. 8A is a simplified schematic illustration of still another embodiment of a detector 850. The detector 850 is substantially similar, if not identical, to the detector 750 illustrated and described above in relation to FIG. 7A. In particular, the detector 850 can again be a chromatic, TDI CCD that can be used with a fringe projection type autofocus system, e.g., the autofocus system 222 (illustrated in FIG. 2A), that is used to measure the position of a work piece, e.g., a wafer 28 (illustrated in FIG. 1). Additionally, the detector 850 again includes a rectangular array of pixels 874 comprising a plurality of rows of pixels 874R (each row extends from left to right in FIG. 8A, i.e. in the +Y direction) and a plurality of columns of pixels 874C (each column extends from top to bottom in FIG. 8A, i.e. in the −X direction). Further, the detector 850 again includes a plurality of masks 876 that are fixed relative to the pixels 874 and that extend over and cover entire columns of pixels 874C. With this design, the detector 850 includes a plurality of active columns 874AC (i.e. uncovered or unmasked columns, shown in white), and a plurality of masked columns 874MC (shown in black). Moreover, in this embodiment, there are again three masked columns 874MC for every active column 874AC, which allows up to four different spectral signals to be collected using a single TDI chip.

Figure 8B:
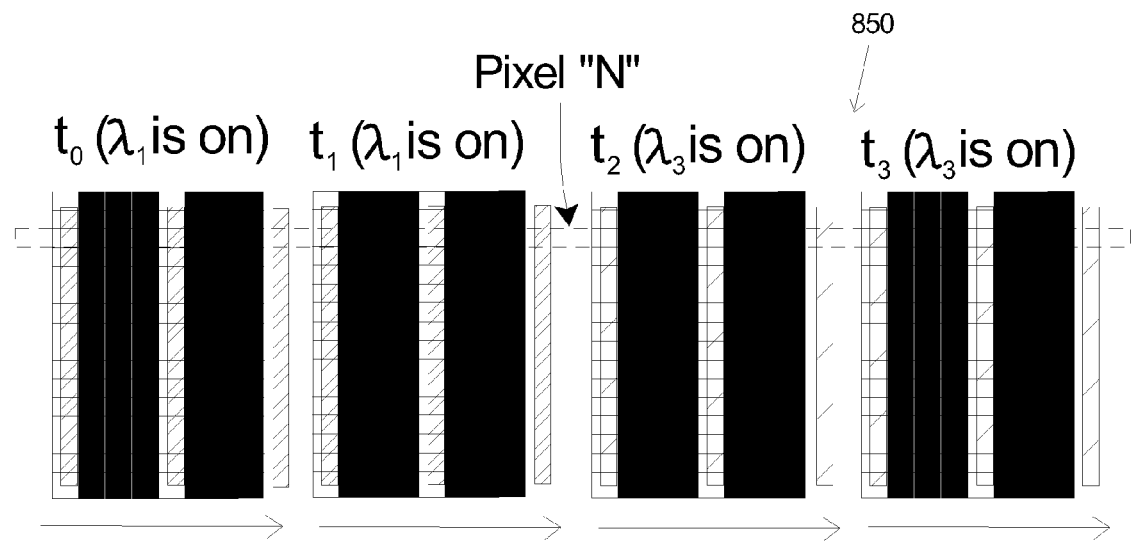
FIG. 8B illustrates the image recorded by active pixels of the detector of FIG. 8A over time.

FIG. 8B illustrates the image recorded by active columns of the detector 850 of FIG. 8A over time. In particular, FIG. 8B shows the image recorded by those active pixels for times $t_0$ through $t_3$ as the light source 248A (illustrated in FIG. 2A) provides light 248B (illustrated in FIG. 2A) to illuminate the detector 850.

Similar to the previous embodiments, the light source 248A (illustrated in FIG. 2A) is again strobed, such that the wavelength of the light provided by the light source 248A is selectively adjusted in discrete increments over time. Stated another way, the wavelength of the light provided by the light source 248A can be strobed for times $t_0$, $t_1$, $t_2$, $t_3$, etc. Additionally and/or alternatively, other characteristics of the light 248B generated by the light source 248A can be selectively adjusted in discrete increments over time. For example, the polarization and/or other characteristics of the light 248B generated by the light source 248A can be adjusted in discrete increments over time.

In this embodiment, however, only two different spectral signals are being collected using a single TDI chip. In particular, as shown in FIG. 8B, at time $t_0$, the light source 248A provides light at wavelength $\lambda_1$ (i.e. $\lambda_1$ is on); at time $t_1$, the light source 248A provides light at wavelength $\lambda_1$ (i.e. $\lambda_1$ is on); at time $t_2$, the light source 248A provides light at wavelength $\lambda_3$ (i.e. $\lambda_3$ is on); at time $t_3$, the light source 248A provides light at wavelength $\lambda_3$ (i.e. $\lambda_3$ is on); etc. Stated another way, in this embodiment, only two spectral signals are being utilized (as opposed to the maximum of four when three masked columns are provided for each active column, as shown in FIGS. 7A-7C) with each source being left on for two TDI charge shift cycles.

Moreover, the rate at which the light source 248A is strobed can vary depending on the overall capabilities of the system. For example, in one non-exclusive embodiment, the light source 248A is strobed at a rate of thirty-four kHz (or 34,000 lines per second), or half as fast as the example of FIGS. 6 and 7. Alternatively, the light source 248A can be strobed at a different rate that is greater than or less than sixty-eight kHz.

Additionally, for purposes of demonstrating the output of the present embodiment, FIG. 8B again isolates a single pixel (i.e. in the X direction) and labels that as Pixel "N" (shown as a dashed rectangular box).

In certain embodiments, in order to build a system based on this TDI mode, the designer must only decide on the maximum number of independent spectral signals desired, which is determined by the number of masked columns that are provided with each active column. The user can always use fewer than the maximum number of independent spectral signals, such as, for example as illustrated in FIG. 8B, by simply leaving source one on for two TDI charge shift cycles, and using source two for two TDI charge shift cycles, and repeating.

Figure 8C:
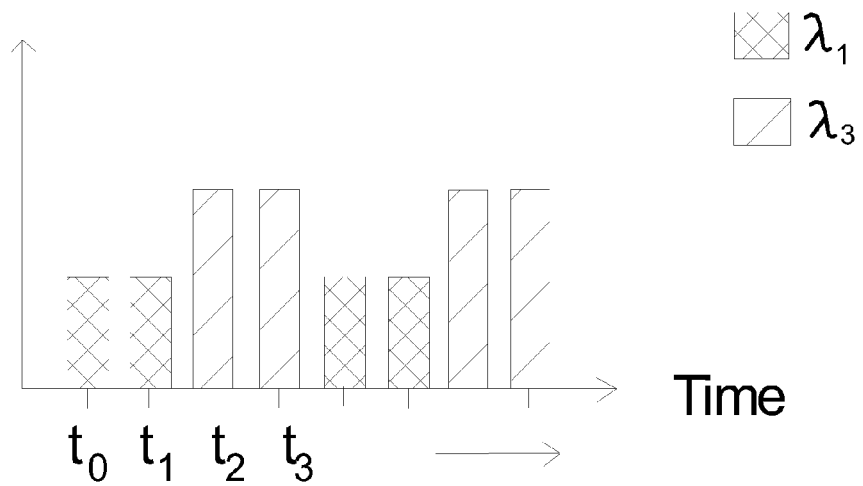
FIG. 8C illustrates the output signal for a single pixel of the detector of FIG. 8A over time.

FIG. 8C illustrates the output signal for a single pixel, i.e. Pixel "N", of the detector 850 of FIGS. 8A and 8B over time. In this case, two consecutive data points in time corresponds to $\lambda_1$, while the next two consecutive data points then correspond to $\lambda_3$. This pattern is then repeated in a two-two-two-two pattern over time. Assuming the object (in the FP AF system this is the wafer 28 (illustrated in FIG. 1)) is moving synchronously to the charge transfer, the result is four repeated images (2 each of 2 different wavelengths) of nearly the same locations on the wafer 28 in x and y interleaved in time. The two repeated images are then combined to accurately determine the position of the wafer 28. Stated another way, in this embodiment, the values measured at a particular location from each of the different wavelengths of light can be combined, e.g., by the control system 224 (illustrated in FIG. 2A), to accurately determine the position of the wafer 28. Additionally, it should be noted that the output signal that is provided from the detector 850 depends on the fringe phase for each wavelength that is provided by the light source 248A (illustrated in FIG. 2A), with the fringe phase varying as the position, i.e. the height, of the wafer 28 varies.

Figure 9A:
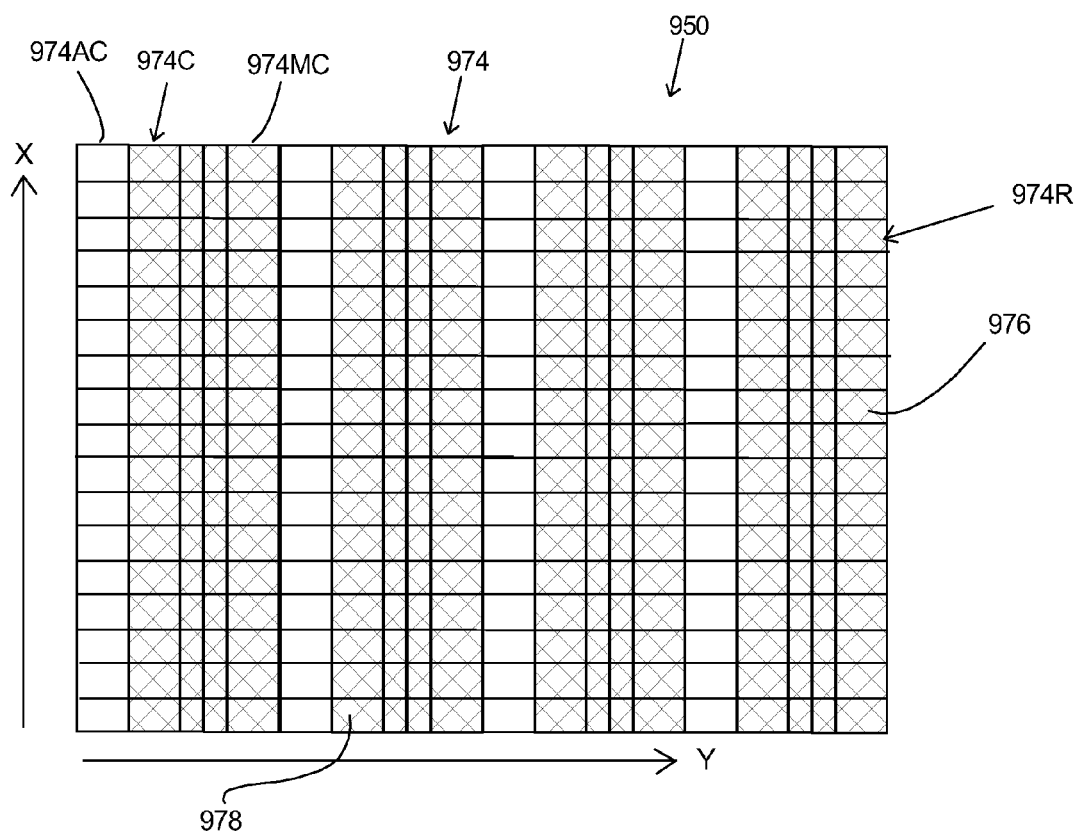
FIG. 9A is a simplified schematic top view illustration of still yet another embodiment of a detector.

FIG. 9A is a simplified schematic top view (XY plane) illustration of still yet another embodiment of a detector 950. As illustrated, the detector 950 is somewhat similar to the detectors 750, 850 illustrated and described above in relation to FIGS. 7A, 8A, respectively. In particular, the detector 950 can again be a chromatic, TDI CCD that can be used with a fringe projection type autofocus system that is used to measure the position of a work piece, e.g., a wafer 28 (illustrated in FIG. 1). Additionally, the detector 950 again includes a rectangular array of pixels 974 comprising a plurality of rows of pixels 974R (each row extends from left to right in FIG. 9A, i.e. in the +Y direction) and a plurality of columns of pixels 974C (each column extends from top to bottom in FIG. 9A, i.e. in the −X direction). Further, the detector 950 again includes a plurality of masks 976 that are fixed relative to the pixels 974 and that extend over and cover entire columns of pixels 974C. With this design, the detector 950 includes a plurality of active columns 974AC (i.e. uncovered or unmasked columns, shown in white)), and a plurality of masked columns 974MC (shown in black). Moreover, in this embodiment, there are again three masked columns 974MC for every active column 974AC, which allows up to four different spectral signals to be collected using a single TDI chip.

Figure 9B:
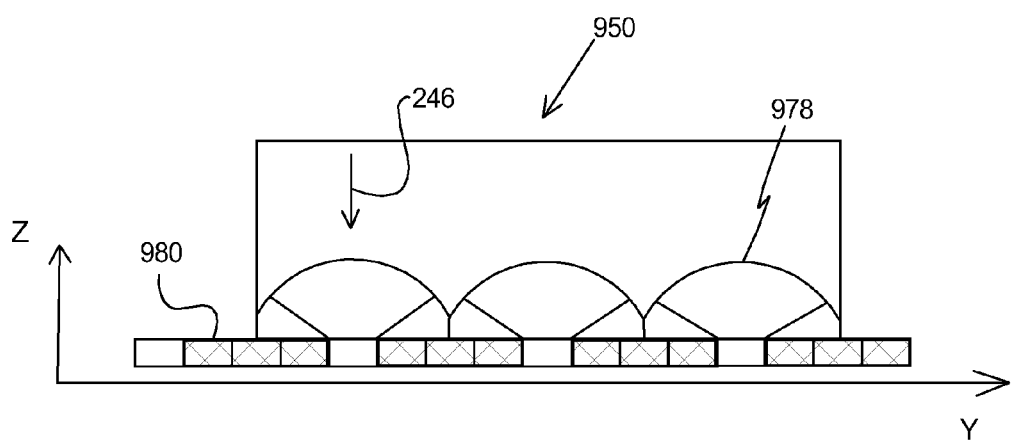
FIG. 9B is a simplified schematic illustration showing fringes of light and a side view (YZ plane) of the detector of FIG. 9A.
Figure 9C:
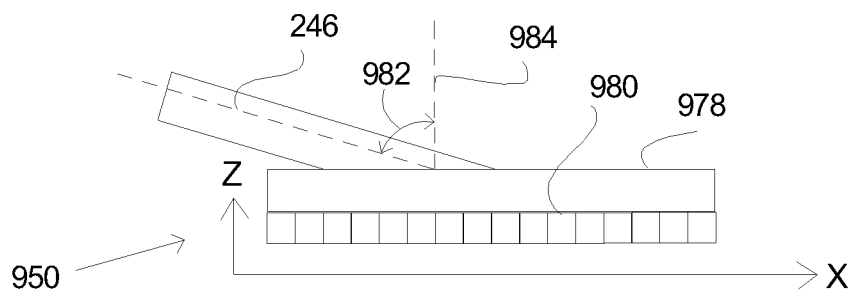
FIG. 9C is a simplified schematic illustration showing fringes of light and a side view (XZ plane) of the detector of FIG. 9A.

However, in this embodiment, as illustrated more clearly in FIGS. 9B and 9C, the detector 950 further includes a lenslet array 978 that is positioned substantially adjacent to a top surface 980 of the array of pixels 974. In particular, FIG. 9B is a simplified schematic illustration showing fringes of light 246 and a side view (YZ plane) of the detector 950 of FIG. 9A.

Additionally, FIG. 9C is a simplified schematic illustration showing fringes of light 246 and a side view (XZ plane) of the detector 950 of FIG. 9A.

In one embodiment, the lenslet array 978 can be a cylindrical lenslet array. Alternatively, the lenslet array 978 can have a different design, i.e. can have a different shape. By placing the lenslet array 978 over the masked top surface 980 of the detector 950, the lenslet array 978 is able to capture most, if not all, of the light that would otherwise be blocked or absorbed by the masked regions, i.e. the masked columns 974MC, on the detector 950. Moreover, the lenslet array 978 redirects the captured light to the active regions, i.e. the active columns 974AC, on the detector 950. By way of example, in the embodiment illustrated in FIGS. 9A-9C, where three-fourths of the pixels 974 are masked, the lenslet array 978 improves the light efficiency of the detector 950 by up to a factor of four compared to a similar detector that does not include the lenslet array 978.

Additionally, as noted above and as shown in FIG. 9C, the detector 950 can be designed such that the fringes of light 246 that impinge on the detector 950 are at a grazing angle of incidence 982 of between approximately thirty and eighty degrees relative to the normal 984 of the detector 950. Moreover, the grazing angle of incidence 982 can be fixed for a given system design (i.e the grazing angle of incidence 982 does not vary for a given fringe projection system). As shown clearly in FIG. 9C, the grazing angle of incidence 982 is about the Y-axis, such that the lenslet array 978 will not cause any problems, e.g., shadowing effects, when used with the detector 950.

As described in detail herein above, the present embodiment uses a single TDI CCD detector to obtain signals with different spectral properties. As a result thereof, multiple CCD chips are not required, thereby eliminating potential problems that can occur when multiple CCD chips are used. For example, multiple CCD chips can be difficult to align, expensive, and can't be used with high angle off-axis illumination. Further, the present embodiment does not use color filters built into the CCD, thereby eliminating additional potential problems that may otherwise exist. For example, some color filters limit the resolution of the TDI sensor in the direction perpendicular to the TDI direction by using columns of chromatic sensors. In addition, if color filters are built into the CCD, the set of wavelengths that can be independently measured is determined at the time the CCD is built. In contrast, the proposed TDI sensor does not have any predetermined spectral properties other than the full spectral response of the light sensitive material. Therefore, the spectral properties of the multiple wavelength signals that are detected can be changed dynamically by simply changing the light source properties. The proposed TDI sensor does not limit the spectral measurements like traditional color CCD sensors in prior art.

It should be noted that a system including the features of the present embodiment may be designed to address the issue of thin film effects (also sometimes referred to as "Goos-Hanchen errors"). Thin film effects involve a shifting of the beam when the beam is incident on an optical interface, e.g., a substrate that is imaged by an imaging optical system in the production of a semiconductor wafer. A proper and necessary approach for compensating for these thin film effects can include a digital approach and/or an analog approach. For example, in one such approach, correcting for these thin film effects for a FP AF system entails signals with different spectra (i.e. different wavelengths) being collected and compared to determine the true wafer height. The combination of the different spectral signals is process dependent. Therefore, the different spectral signals (which, as shown in the above embodiments can be two or four different spectral signals, or another number of spectral signals) sent to the wafer 28 and TDI CCD detector can change depending on the process. Since the chromatic TDI CCD detector of the present embodiment, as described herein, does not include any spectral filters built into the detector, the desired spectral signals can be set by the illumination system. A non-exclusive example of a system and method for compensating for these thin film effects is disclosed in U.S. patent application Ser. No. 12/884,890, filed on Sep. 17, 2010, and entitled "GOOS-HANCHEN COMPENSATION IN AUTOFOCUS SYSTEMS". As far as permitted, the contents of U.S. patent application Ser. No. 12/884,890 are incorporated herein by reference.

Using a line-scan camera in its natural TDI mode for a FP AF system, as opposed to the area mode, means a faster, lower noise system when all other factors are the same. In order to correct for thin film effects, as discussed above, signals with different spectral properties must be obtained. As provided herein, this can be accomplished in a fast, simple, inexpensive way through the use of a TDI sensor, as such a detector a) does not set the properties of the spectral bands in the sensor; and b) does not require any prisms or other complex optical components.

Figure 10:
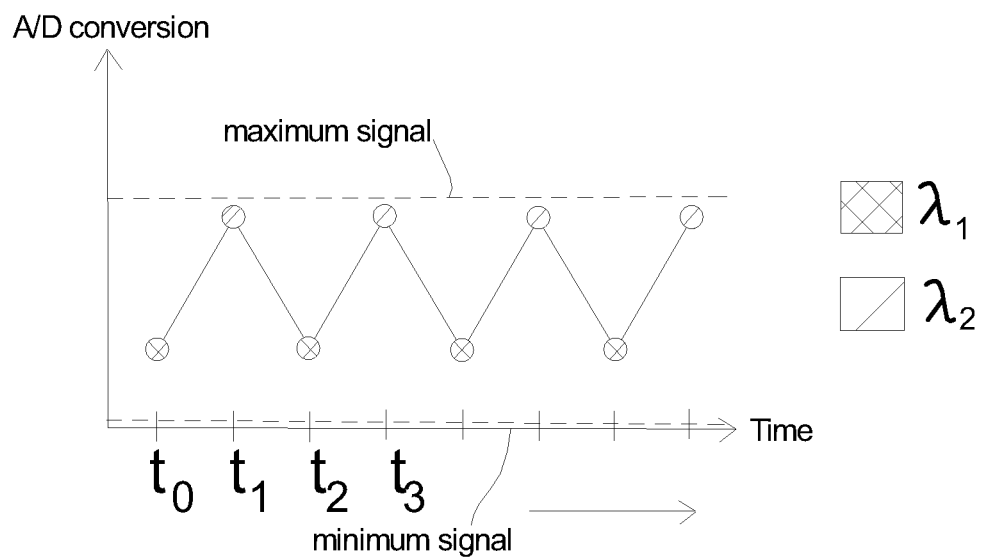
FIG. 10 is a graph that illustrates the electronic Nyquist rate.

Additionally, in certain embodiments, two important system capabilities must be met in order for the autofocus system and the detector to work effectively as desired. First, the light sources must be able to turn on/off at least as fast as the maximum line rate for the TDI sensor. Second, the camera electronics (i.e. the ADC) must be able to measure signals near the electronic Nyquist rate, as shown in FIG. 10. The Nyquist rate is the minimum sampling rate required to avoid aliasing, which can be described as being equal to twice the highest frequency contained within the signal. The importance of the two noted system capabilities is due to the fact that if such system capabilities do not exist, the phase of the projected fringes from the light source for spectral band 1 ($\lambda_1$) and spectral band 2 ($\lambda_2$) could be completely out of phase. This, in turn, could result in a signal for Pixel "N" as a function of time that oscillates between the minimum and maximum electrical values at the line rate. As long as the necessary electronics can be built into the system to maintain contrast for this situation, this potential problem can be effectively avoided.

In summary, the problem of measuring color images using a single TDI CCD detector, as is proposed herein, is solved by masking off parts of the TDI detector chip and synchronizing the light sources to the charge transfer in such a way that multiple color images can be captured simultaneously. It should be further noted that the ability to capture multiple color images simultaneously is especially useful for the fringe projection type autofocus system.

The above embodiments were described as examples of the projection exposure apparatus of the step-and-scan method, but the present invention is also applicable to the AF sensor in the projection exposure apparatus of the step-and-repeat method. The present invention is further applicable to the AF sensor in liquid immersion type exposure apparatus, for example, as disclosed in U.S. Patent Application Publication No. 2011/0086315.

Furthermore, the above embodiments can also be used in combination with the AF sensor configured to reduce errors due to reflecting surfaces as disclosed, for example, in U.S. Patent Application Publication No. 2009/0116039 and U.S. Pat. No. 8,149,382.

Further, illumination light is not limited to ArF excimer laser light (with a wavelength of 193 nm), but can also include ultraviolet light such as described in, for example, U.S. Pat. No. 7,023,610; a harmonic wave, which is obtained by amplifying a single-wavelength laser beam in the infrared or visible range emitted by a DFB semiconductor laser; or a fiber laser with a fiber amplifier doped with, for example, erbium (or both erbium and ytterbium), with the wavelength being converted into ultraviolet light using a nonlinear optical crystal, can also be used as vacuum ultraviolet light.

Further, in the embodiment above, a light transmissive type mask (reticle) is used, which is obtained by forming a predetermined light-shielding pattern (or a phase pattern or a light-attenuation pattern) on a light-transmitting substrate, as disclosed in, for example, U.S. Pat. No. 6,778,257. Alternatively, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, a stage on which a work piece, e.g., a wafer, a glass plate or the like, is mounted is scanned relative to the variable shaped mask, and therefore the equivalent effect to the embodiment above can be obtained by measuring the position of this work piece using the position system.

Further, as disclosed in, for example, PCT International Publication No. 2001/035168, the embodiment above can also be applied to an exposure apparatus (a lithography system) in which line-and-space patterns are formed on wafer by forming interference fringes on a work piece.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to the exposure apparatus used for manufacturing semiconductor devices. For example, the embodiment above can also be widely applied to an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiment above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

The surface position detecting apparatus and exposure apparatus according to the foregoing embodiments are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling:

adjustment for achieving the optical accuracy for various optical systems; adjustment for achieving the mechanical accuracy for various mechanical systems; and adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies of the entire exposure apparatus. The manufacture of the exposure apparatus is desirably performed in a clean room in which the temperature, cleanliness, etc. are controlled.

Incidentally, the disclosures of all publications, the PCT International Publications, the U.S. patent application Publications and the U.S. patents that are cited in the description so far related to exposure apparatuses and the like are each incorporated herein by reference.

Figure 11A:
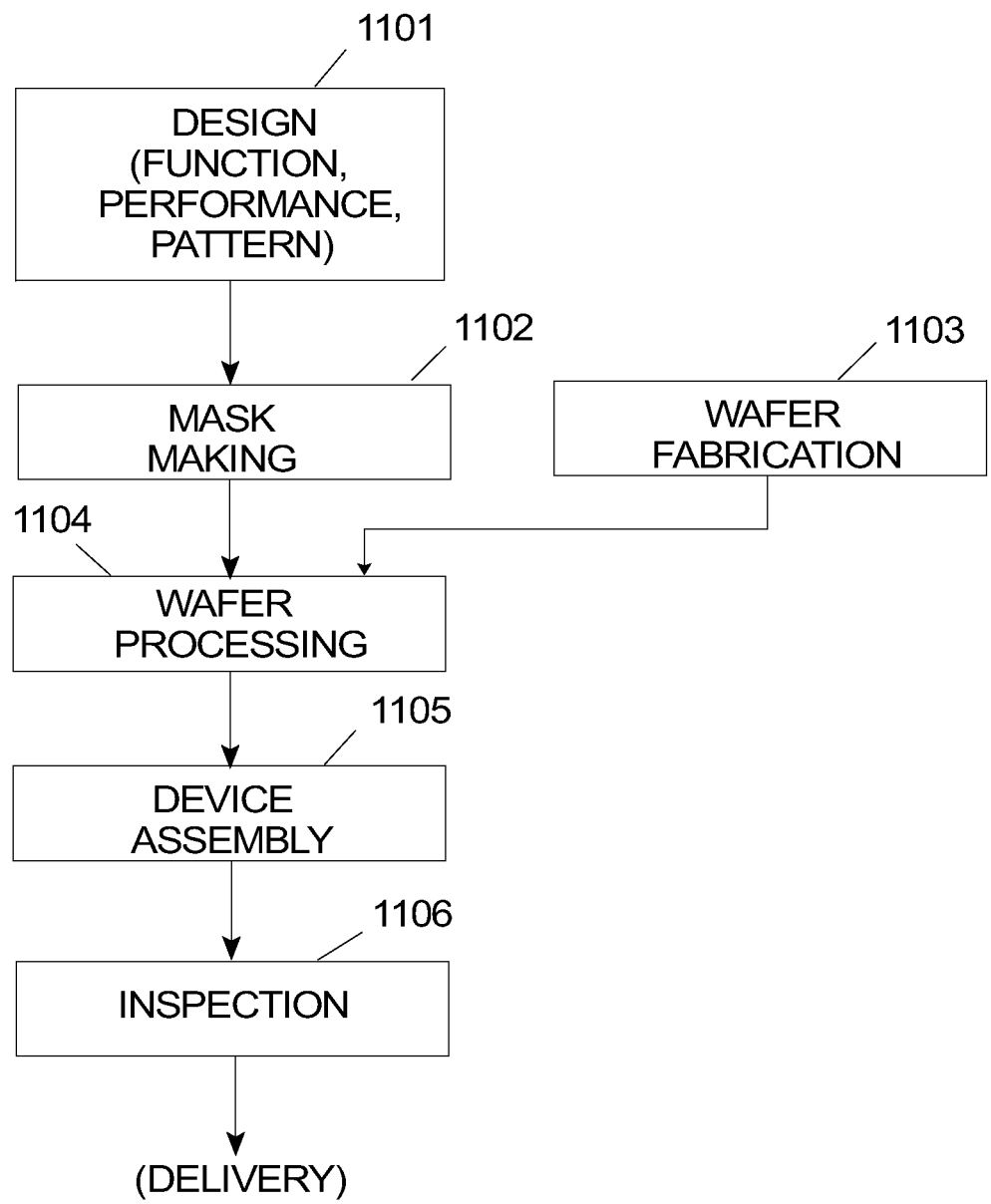
FIG. 11A is a flow chart that outlines a process for manufacturing a device in accordance with the present embodiment.

Semiconductor devices can be fabricated using the above described systems, by the process shown generally in FIG. 11A. In step 1101, the device's function and performance characteristics are designed. Next, in step 1102, a mask (reticle) having a pattern is designed according to the previous designing step, and in a parallel step 1103, a wafer is made from a silicon material. In step 1104, the mask pattern designed in step 1102 is exposed onto the wafer from step 1103 by a photolithography system described hereinabove in accordance with the present embodiment. In step 1105, the semiconductor device is assembled (including the dicing process, bonding process and packaging process). Finally, the device is then inspected in step 1106.

Figure 11B:
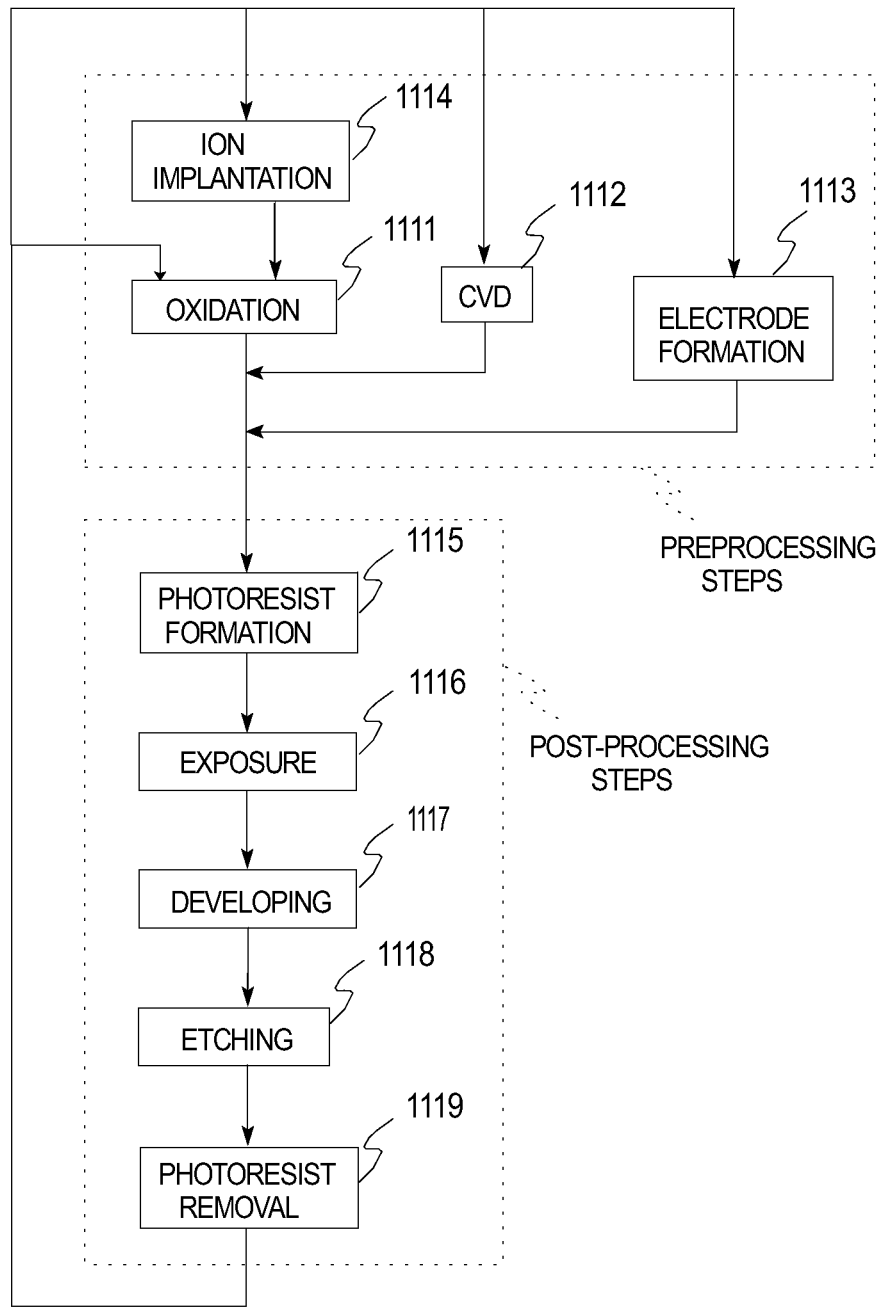
FIG. 11B is a flow chart that outlines device processing in more detail.

FIG. 11B illustrates a detailed flowchart example of the above-mentioned step 1104 in the case of fabricating semiconductor devices. In FIG. 11B, in step 1111 (oxidation step), the wafer surface is oxidized. In step 1112 (CVD step), an insulation film is formed on the wafer surface. In step 1113 (electrode formation step), electrodes are formed on the wafer by vapor deposition. In step 1114 (ion implantation step), ions are implanted in the wafer. The above mentioned steps 1111-1114 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1115 (photoresist formation step), photoresist is applied to a wafer. Next, in step 1116 (exposure step), the above-mentioned exposure device is used to transfer the circuit pattern of a mask (reticle) to a wafer. Then in step 1117 (developing step), the exposed wafer is developed, and in step 1118 (etching step), parts other than residual photoresist (exposed material surface) are removed by etching. In step 1119 (photoresist removal step), unnecessary photoresist remaining after etching is removed. Multiple circuit patterns are formed by repetition of these preprocessing and post-processing steps.

While a number of exemplary aspects and embodiments of a position system 22 and an autofocus system 22A have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A detector for detecting light from a light source, the detector comprising:
   a single array of pixels including (i) a plurality of rows of pixels and (ii) a plurality of columns of pixels having at least a first active column of pixels and a spaced apart second active column of pixels; wherein the first active column of pixels and the second active column of pixels are arranged along a first direction, and are spaced apart from one another along a second direction that crosses a first direction; and
   a first mask that covers one of the plurality of columns of pixels to provide a first masked column of pixels that is positioned between the first active column of pixels and the second active column of pixels;
   wherein a charge is generated from the light impinging on the first active column of pixels, is transferred to the first masked column of pixels, and subsequently is transferred to the second active column of pixels.

2. The detector of claim 1 wherein an accumulation of the charge from the light impinging on the first active column of pixels and the second active column of pixels generates an output charge.

3. The detector of claim 1 wherein no active column of pixels is positioned adjacent to another active column of pixels.

4. The detector of claim 1 wherein the plurality of columns of pixels further includes a third active column of pixels that is spaced apart from the first active column of pixels and the second active column of pixels, and further comprising a second mask that covers one of the plurality of columns of pixels to provide a second masked column of pixels that is positioned between the second active column of pixels and the third active column of pixels.

5. The detector of claim 4 wherein the plurality of columns of pixels further includes a fourth active column of pixels that is spaced apart from the first active column of pixels, the second active column of pixels, and the third active column of pixels, and further comprising a third mask that covers one of the plurality of columns of pixels to provide a third masked column of pixels that is positioned between the third active column of pixels and the fourth active column of pixels.

6. The detector of claim 1 further comprising a second mask that covers one of the plurality of columns of pixels to provide a second masked column of pixels that is positioned between the first active column of pixels and the second active column of pixels.

7. The detector of claim 6 further comprising a third mask that covers one of the plurality of columns of pixels to provide a third masked column of pixels that is positioned between the first active column of pixels and the second active column of pixels.

8. The detector of claim 1 further comprising a lenslet array that is positioned substantially adjacent to a top surface of the detector.

9. The detector of claim 1 wherein the first mask is positioned between the first active column of pixels and the second active column of pixels in relation to the second direction.

10. A position system for measuring the position of a work piece, the position system comprising a light source that generates (i) a first light beam that is directed at the work piece at a first time, the first light beam having a first characteristic, and (ii) a second light beam that is directed at the work piece at a second time, the second light beam having a second characteristic that is different than the first characteristic; and the detector of claim 1 that detects the first light beam and the second light beam from the light source.

11. The position system of claim 10 wherein the first characteristic is a first wavelength range and the second characteristic is a second wavelength range that is different than the first wavelength range.

12. The position system of claim 10 wherein the first characteristic is a first polarization and the second characteristic is a second polarization that is different than the first polarization.

13. The position system of claim 10 wherein the first characteristic includes the first light beam being a measurement beam, and wherein the second characteristic includes the second light beam being a reference beam.

14. The position system of claim 10 wherein the detector further comprises a second mask that covers one of the plurality of columns of pixels to provide a second masked column of pixels that is positioned between the first active column of pixels and the second active column of pixels; wherein the light source further generates a third light beam that is directed at the work piece at a third time, the third light beam having a third characteristic that is different than at least one of the first characteristic and the second characteristic; and wherein the detector detects the first light beam, the second light beam and the third light beam from the light source.

15. The position system of claim 14 wherein the detector further comprises a third mask that covers one of the plurality of columns of pixels to provide a third masked column of pixels that is positioned between the first active column of pixels and the second active column of pixels; wherein the light source further generates a fourth light beam that is directed at the work piece at a fourth time, the fourth light beam having a fourth characteristic that is different than at least one of the first characteristic, the second characteristic and the third characteristic; and wherein the detector detects the first light beam, the second light beam, the third light beam and the fourth light beam from the light source.

16. An exposure apparatus including a stage assembly that positions a work piece, and the position system of claim 10 that measures the position of the workpiece.

17. A process for manufacturing a wafer that includes the steps of providing a substrate, and transferring a mask pattern to the substrate with the exposure apparatus of claim 16.

18. A method for detecting light from a light source, the method comprising:
    providing a single array of pixels including (i) a plurality of rows of pixels and (ii) a plurality of columns of pixels having at least a first active column of pixels and a spaced apart second active column of pixels; wherein the first active column of pixels and the second active column of pixels are arranged along a first direction, and are spaced apart along a second direction that is orthogonal to the first direction;
    covering one of the plurality of columns of pixels with a first mask to provide a first masked column of pixels that is positioned between the first active column of pixels and the second active column of pixels;
    generating a charge from the light impinging on the first active column of pixels;
    transferring the charge from the first active column of pixels to the first masked column of pixels; and
    subsequently transferring the charge to the second active column of pixels.

19. A position system for measuring the position of a work piece that is moved along a first direction, the position system comprising:
    a light source that generates (i) a first light beam that is directed at the work piece at a first time, the first light beam having a first characteristic, and (ii) a second light beam that is directed at the work piece at a second time, the second light beam having a second characteristic that is different than the first characteristic; and
    a detector comprising an array of pixels that detects the first light beam and the second light beam from the light source, the array of pixels including a first column of pixels that are arranged along a second direction and a second column of pixels that are arranged along the second direction, wherein the first and second column of pixels are spaced apart from one another along a third direction that crosses to the second direction, and wherein the third direction corresponds to the first direction.

20. The position system of claim 19, wherein the first light beam is directed at a first point on the work piece at the first time, and the second light beam is directed at a second point on the work piece at the second time.

21. The position system of claim 20, wherein the first point is on the first column of pixels at the first time, and the second point is on the second column of pixels at the second time.

22. The position system of claim 21, further comprising a control system which controls the light source.

23. The position system of claim 19 wherein no active column of pixels is positioned adjacent to the first column of pixels and the second column of pixels.

24. The position system of claim 19 wherein the first characteristic is a first wavelength range and the second characteristic is a second wavelength range that is different than the first wavelength range.

25. The position system of claim 19 wherein the first characteristic is a first polarization and the second characteristic is a second polarization that is different than the first polarization.

26. An exposure apparatus including the position system of claim 19 that measures the position of the workpiece.

27. A process for manufacturing a wafer that includes the steps of providing a substrate, and transferring a pattern to the substrate with the exposure apparatus of claim 26.

* * * * *